United States Patent
Nardi et al.

(10) Patent No.: US 10,050,194 B1
(45) Date of Patent: Aug. 14, 2018

(54) RESISTIVE MEMORY DEVICE INCLUDING A LATERAL AIR GAP AROUND A MEMORY ELEMENT AND METHOD OF MAKING THEREOF

(71) Applicant: SANDISK TECHNOLOGIES LLC, Plano, TX (US)

(72) Inventors: Federico Nardi, San Jose, CA (US); Chu-Chen Fu, San Ramon, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/478,637

(22) Filed: Apr. 4, 2017

(51) Int. Cl.
 *H01L 45/00* (2006.01)
 *H01L 27/24* (2006.01)

(52) U.S. Cl.
 CPC ...... *H01L 45/1233* (2013.01); *H01L 27/2436* (2013.01); *H01L 45/06* (2013.01); *H01L 45/1253* (2013.01); *H01L 45/144* (2013.01); *H01L 45/146* (2013.01); *H01L 45/147* (2013.01); *H01L 45/1608* (2013.01); *H01L 45/1675* (2013.01)

(58) Field of Classification Search
 CPC ............. H01L 27/2436; H01L 45/1233; H01L 45/1253; H01L 45/1675
 See application file for complete search history.

(56) References Cited

U.S. PATENT DOCUMENTS

| | | | |
|---|---|---|---|
| 7,238,959 B2 | 7/2007 | Chen | |
| 7,449,710 B2 * | 11/2008 | Lung | H01L 45/06 257/1 |
| 8,026,503 B2 | 9/2011 | Tu | |
| 8,288,750 B2 | 10/2012 | Shen et al. | |
| 8,658,499 B2 | 2/2014 | Makala et al. | |
| 9,177,966 B1 | 11/2015 | Rabkin et al. | |
| 9,240,458 B2 | 1/2016 | Na et al. | |
| 9,245,849 B2 | 1/2016 | Park et al. | |

(Continued)

FOREIGN PATENT DOCUMENTS

| | | |
|---|---|---|
| CN | 104362251 A | 2/2015 |
| JP | 2008218541 A | 9/2008 |
| WO | WO2005011011 A1 | 2/2005 |

OTHER PUBLICATIONS

U.S. Appl. No. 15/299,919, filed Oct. 21, 2016, Wu et al.

(Continued)

*Primary Examiner* — Allison P Bernstein
(74) *Attorney, Agent, or Firm* — The Marbury Law Group PLLC

(57) ABSTRACT

First electrically conductive lines can be formed over a substrate. A two-dimensional array of vertical stacks can be formed, each of which includes a first electrode, an in-process resistive memory material portion, and a second electrode over the first electrically conductive line. The sidewalls of the in-process resistive memory material portions are laterally recessed with respect to sidewalls of the first electrode and the second electrode to form resistive memory material portions having reduced lateral dimensions. A dielectric material layer is formed by an anisotropic deposition to form annular cavities that laterally surround a respective one of the resistive memory material portions. Second electrically conductive lines can be formed on the second electrodes.

9 Claims, 21 Drawing Sheets

(56) References Cited

U.S. PATENT DOCUMENTS

| | | | |
|---|---|---|---|
| 9,356,031 | B2 | 5/2016 | Lee et al. |
| 9,379,004 | B1 | 6/2016 | Kwon et al. |
| 9,449,982 | B2 | 9/2016 | Lu et al. |
| 9,515,085 | B2 | 12/2016 | Rabkin et al. |
| 2008/0265238 | A1* | 10/2008 | Chen ............... H01L 45/06 257/3 |
| 2009/0101883 | A1 | 4/2009 | Lai et al. |
| 2011/0037045 | A1* | 2/2011 | Fukumizu ......... H01L 27/101 257/3 |
| 2013/0221309 | A1* | 8/2013 | Lee ................ H01L 45/085 257/2 |
| 2015/0171014 | A1 | 6/2015 | Park et al. |
| 2015/0243884 | A1 | 8/2015 | Brightsky et al. |
| 2016/0064532 | A1 | 3/2016 | Makala et al. |

OTHER PUBLICATIONS

U.S. Appl. No. 15/411,152, filed Jan. 20, 2017, Shimabukuro et al.
U.S. Appl. No. 15/413,034, filed Jan. 23, 2017, Shukia et al.
Kim, S. et al., "A Phase Change Memory Cell with Metallic Surfactant Layer as a Resistance Drift Stabilizer," Proceeding of Electron Devices Meeting (IEDM), 2013, p. 762.
Seo, J. et al., "Highly Reliable M1X MLC NAND Flash Memory Cell with Novel Active Air-Gap and p+ Poly Process Integration Technologies," Proceeding of the Dectron Devices Meeting (EOM), 2013, p. 76.
International Search Report and Written Opinion of the International Search Authority for International Patent Application No. PCT/US2018/018988, dated Jun. 22, 2018, 18 pages.
Muneer, S. et al., "Vacuum-Insulated Self-Aligned Nanowire Phase-Change Memory Devices," IEEE Transactions on Electron Devices, vol. 62, No. 5, pp. 1668-1671, (2015).

\* cited by examiner

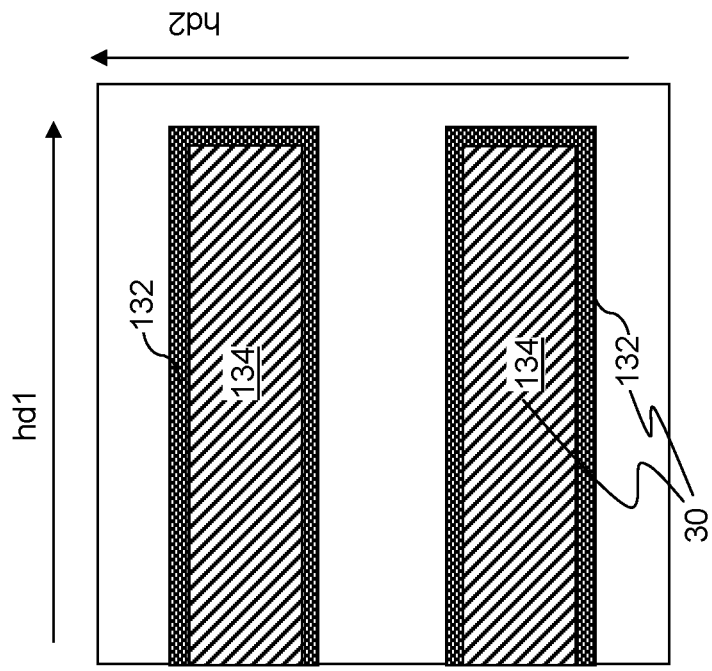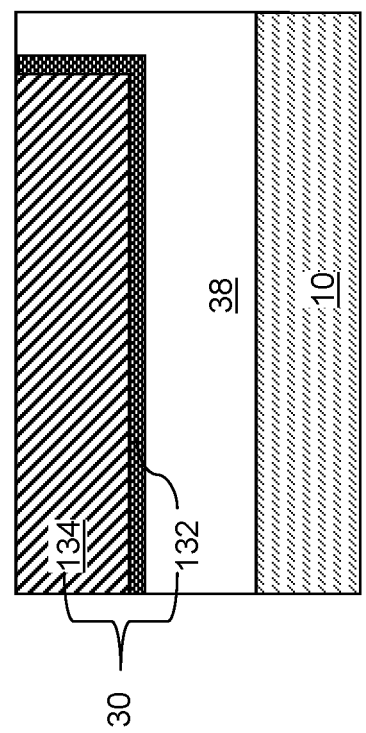
FIG. 2B
FIG. 2A

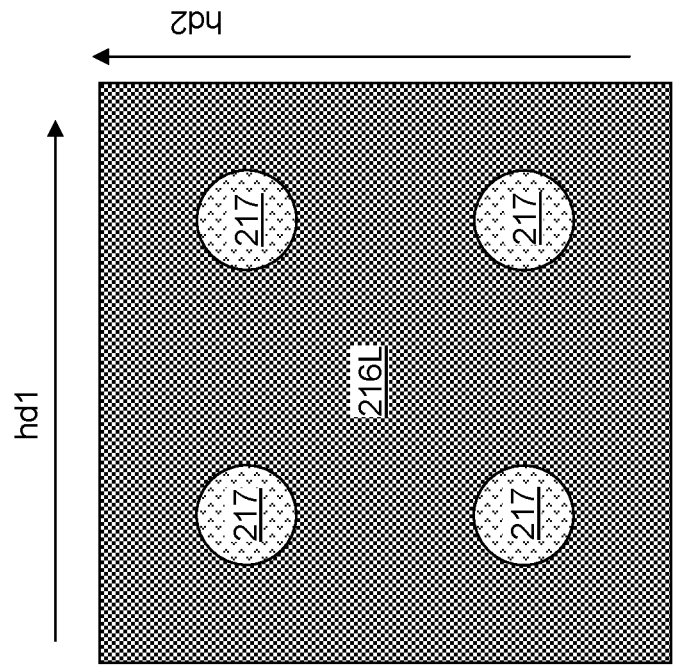
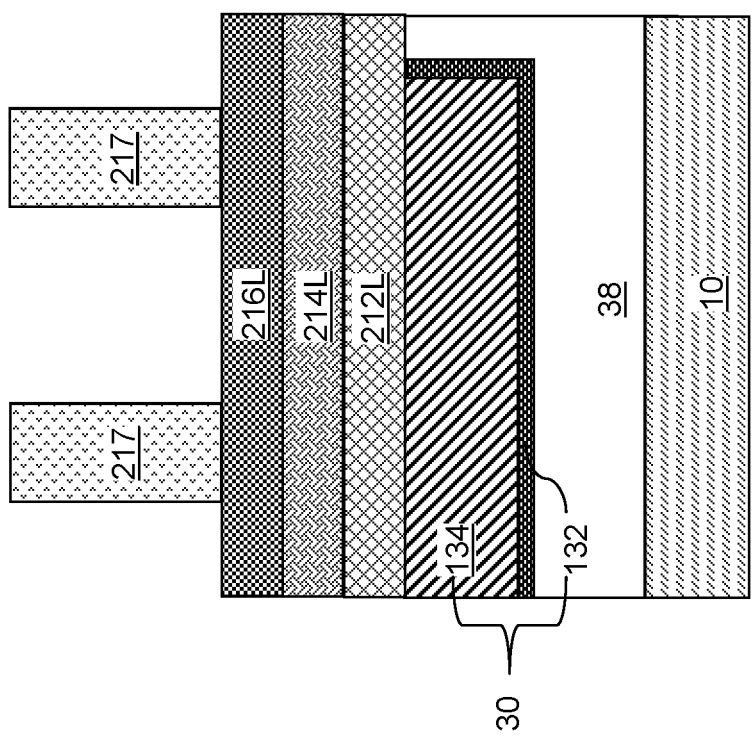
FIG. 4A
FIG. 4B

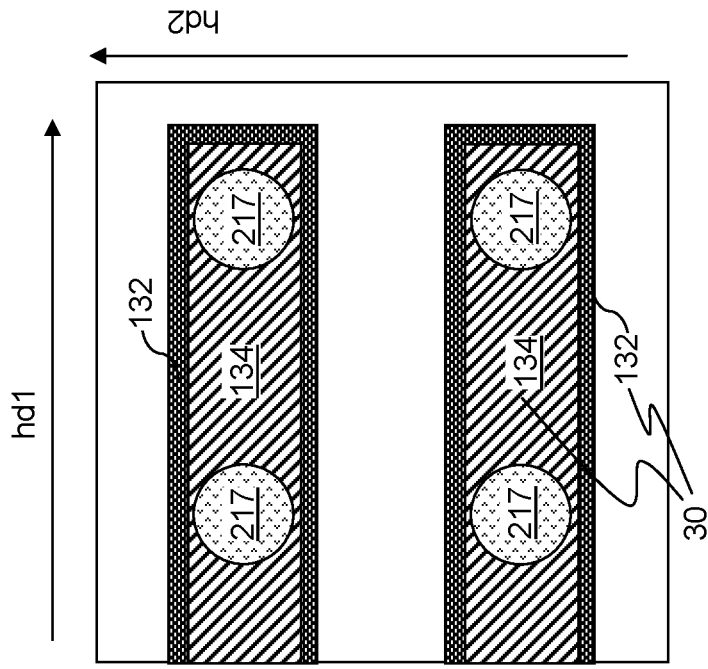
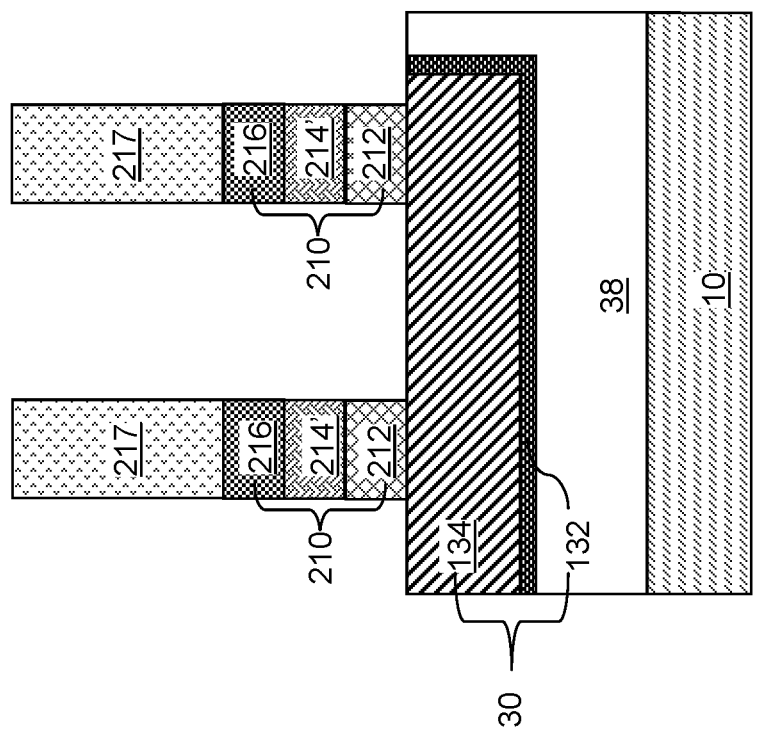
FIG. 5A
FIG. 5B

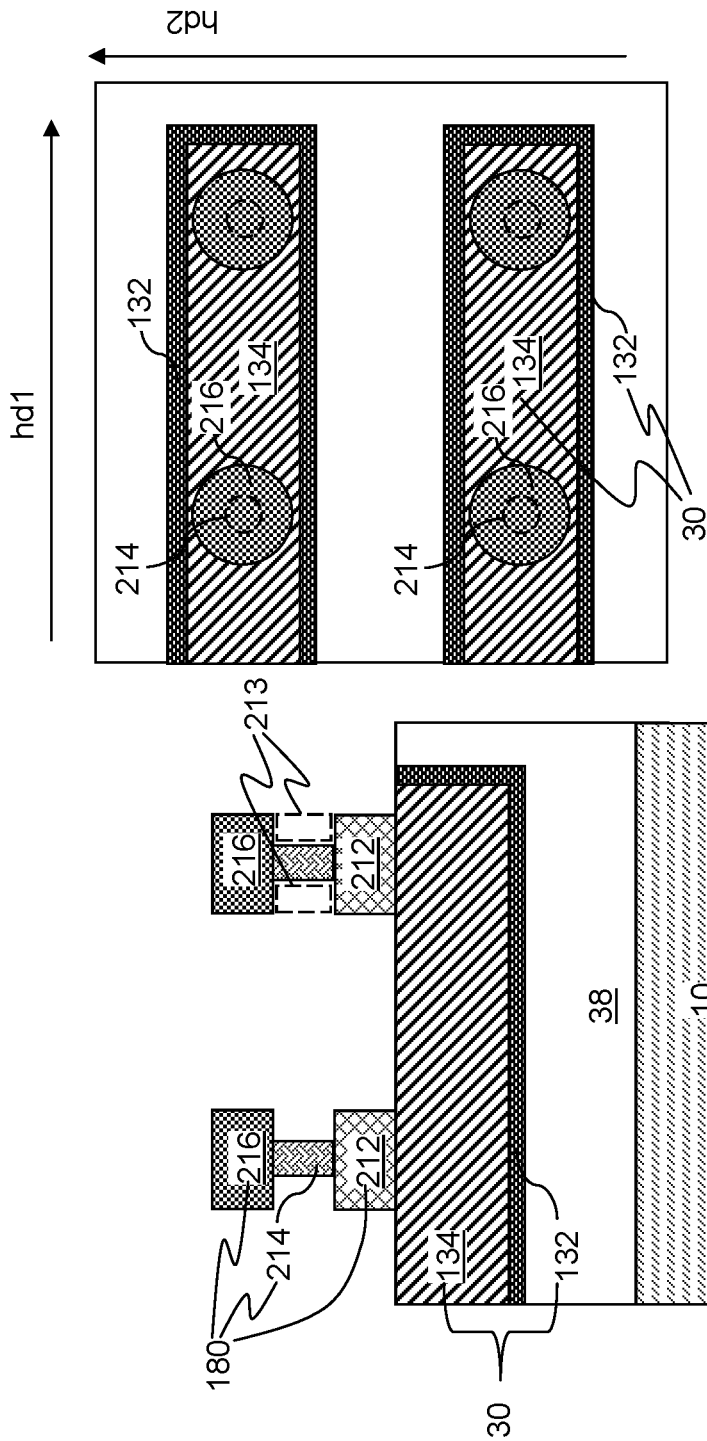

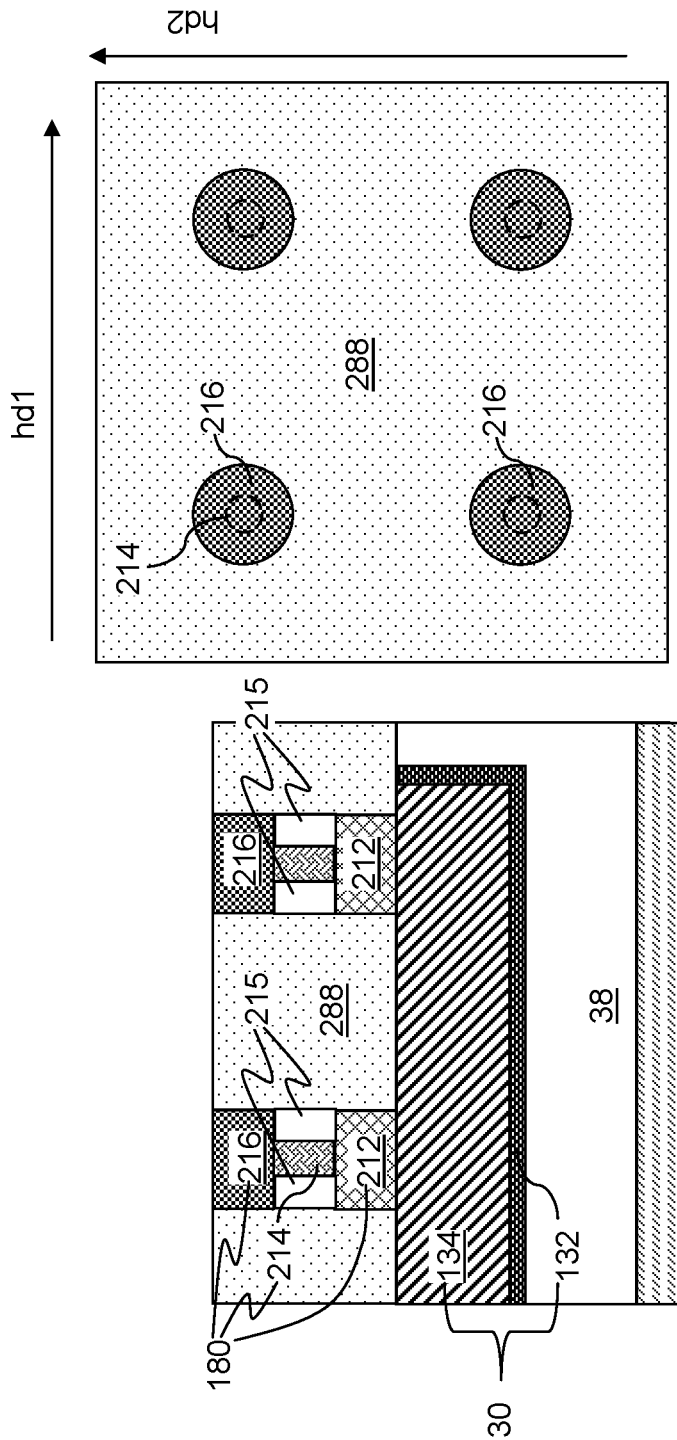

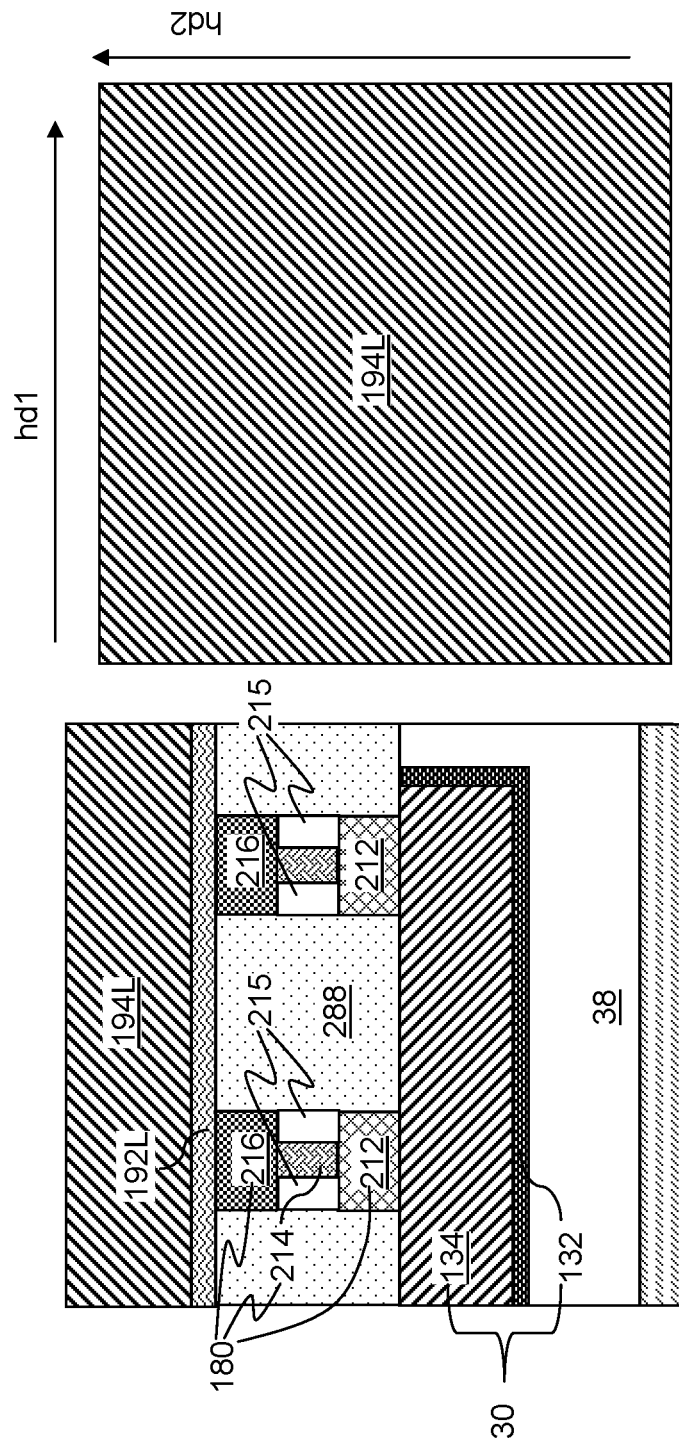

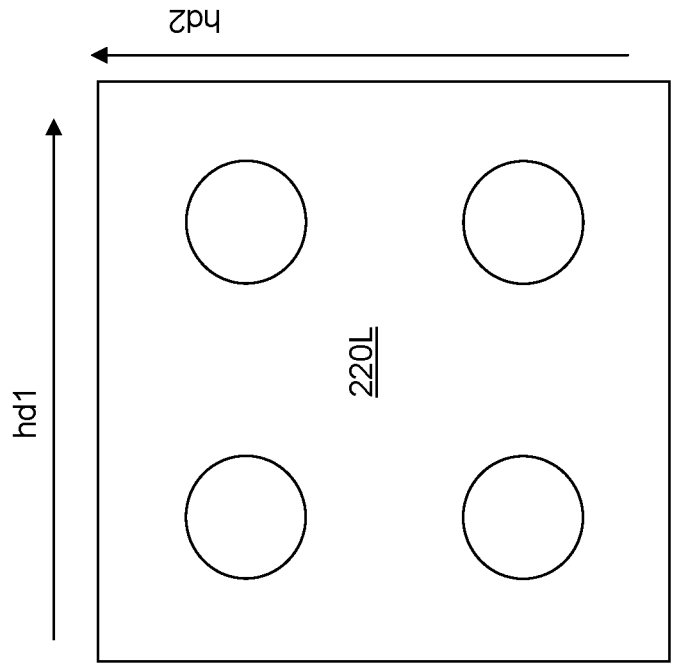
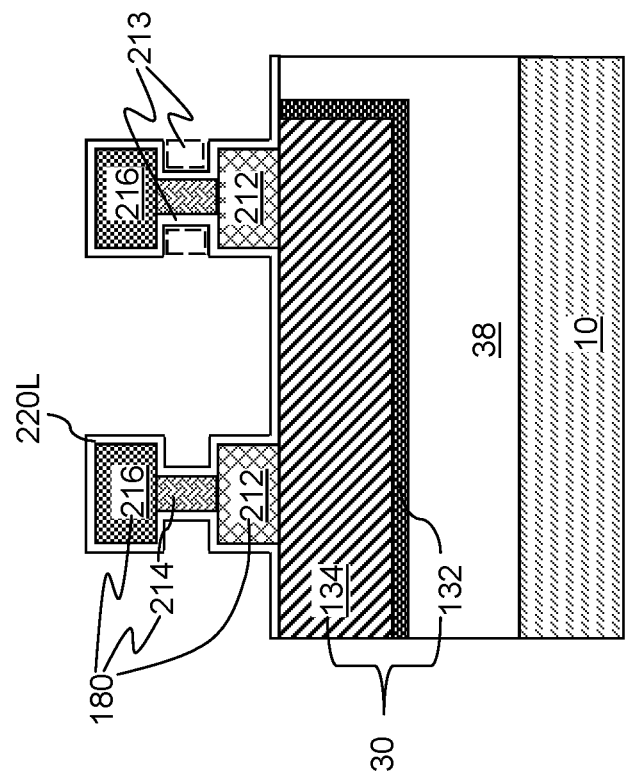
FIG. 10A
FIG. 10B

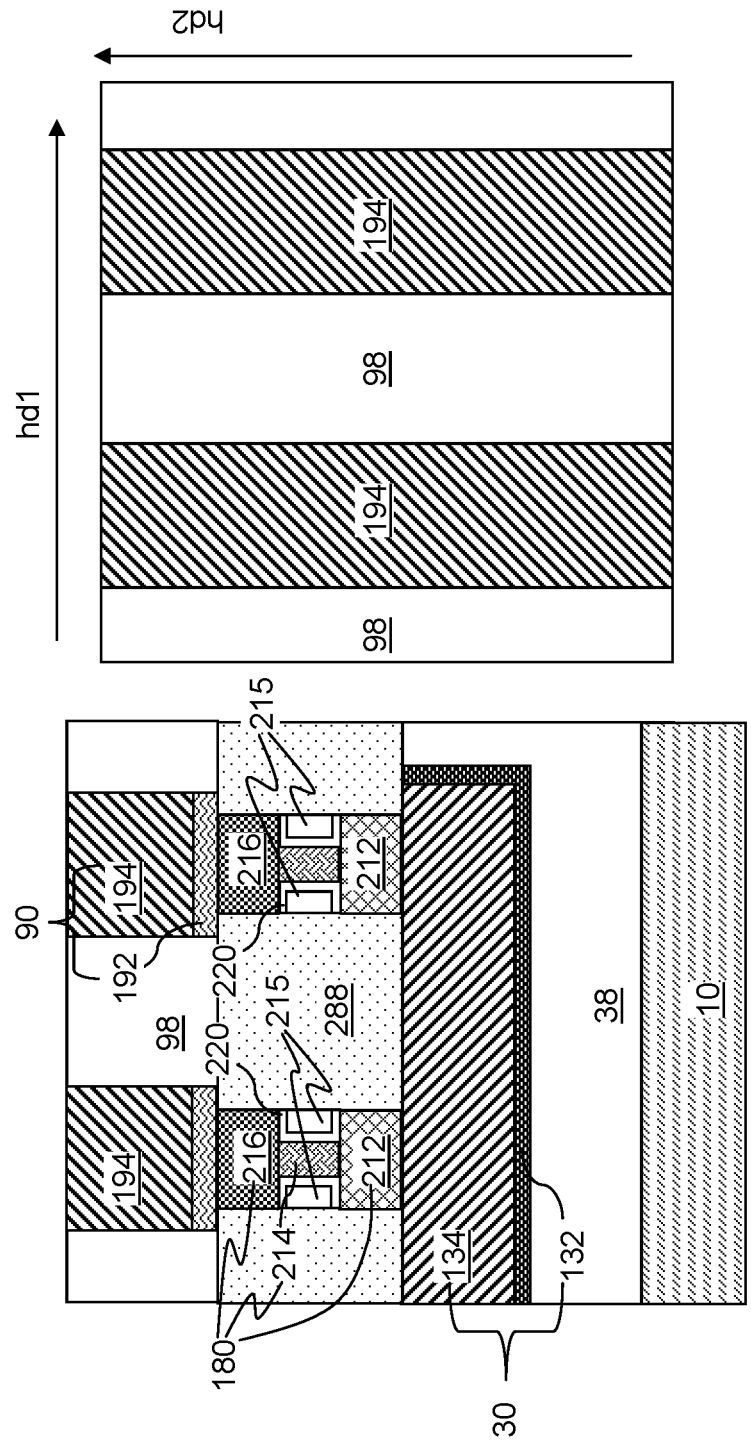

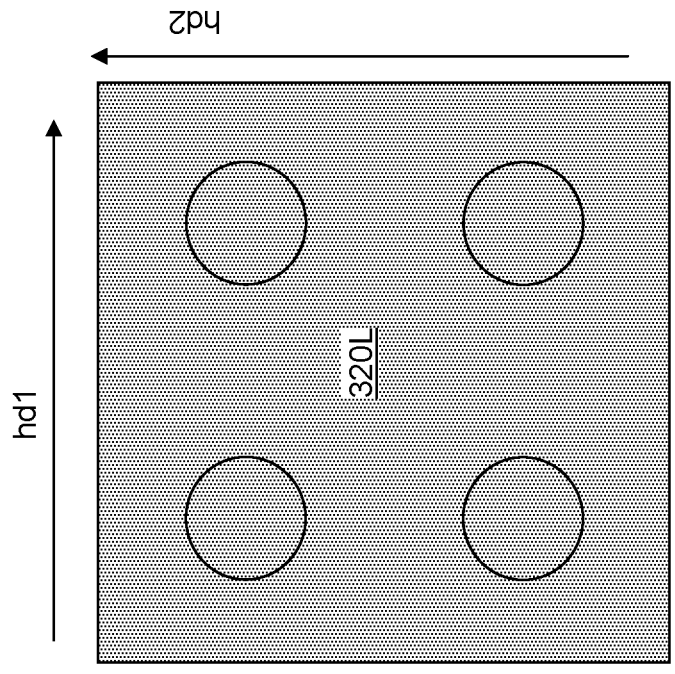
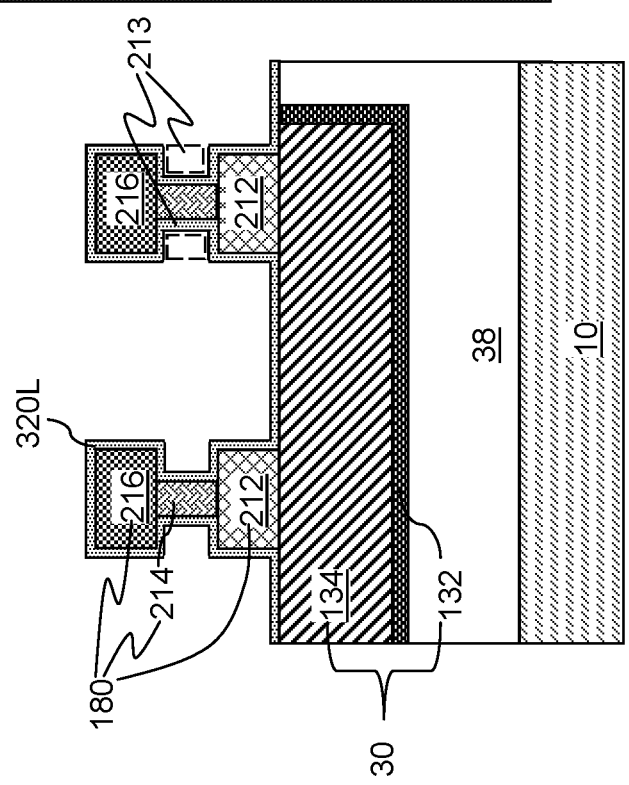
FIG. 14A
FIG. 14B

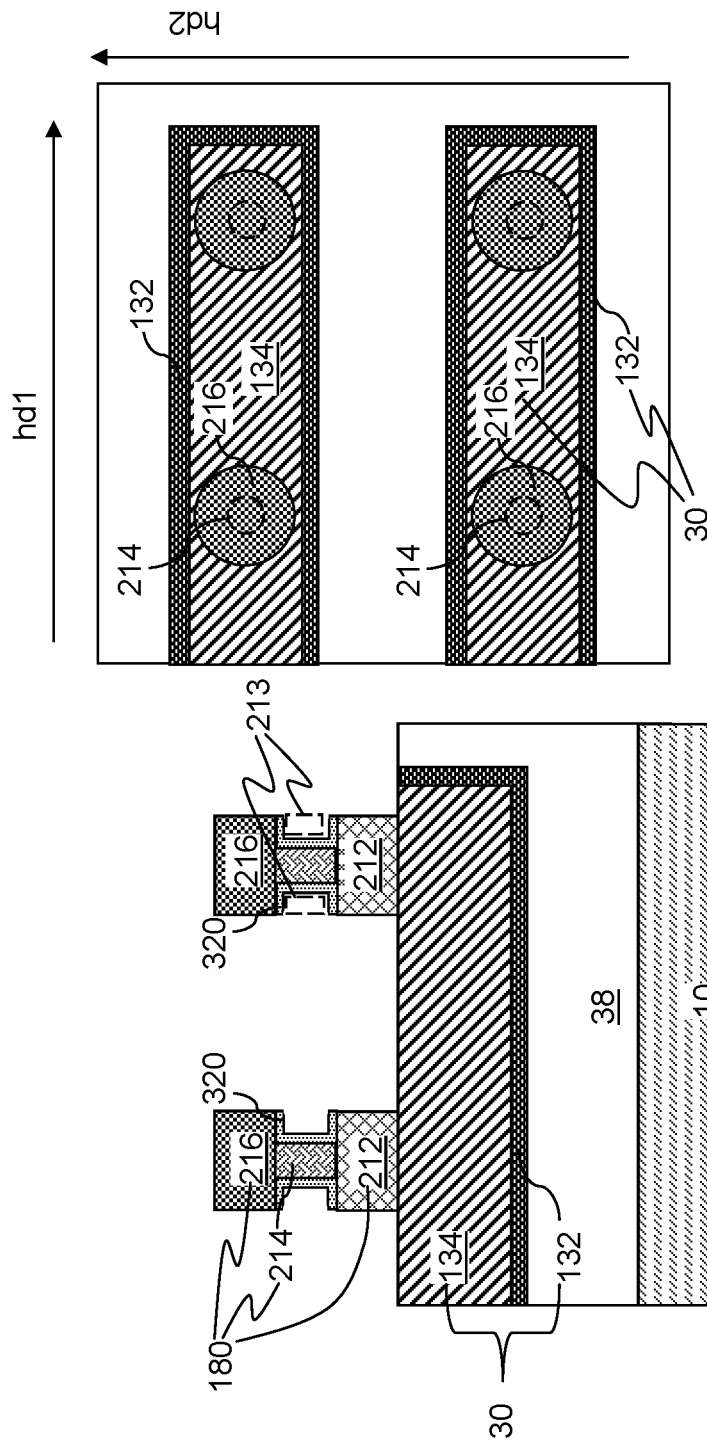

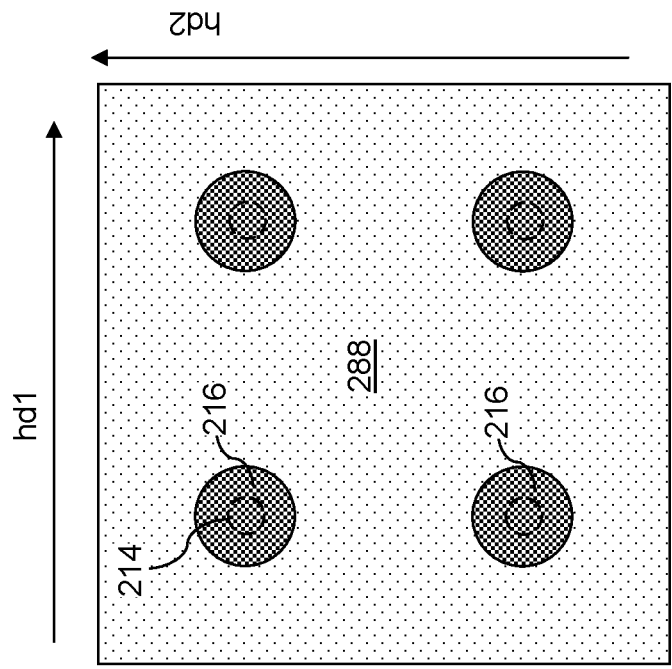
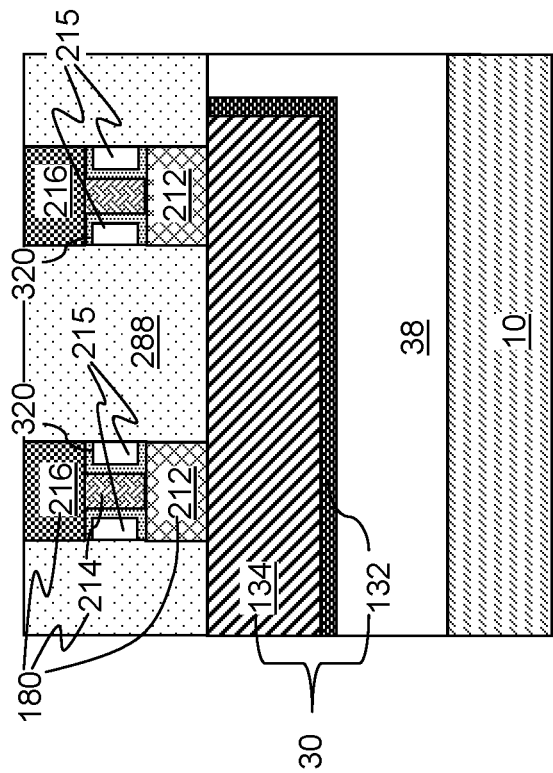
FIG. 16B
FIG. 16A

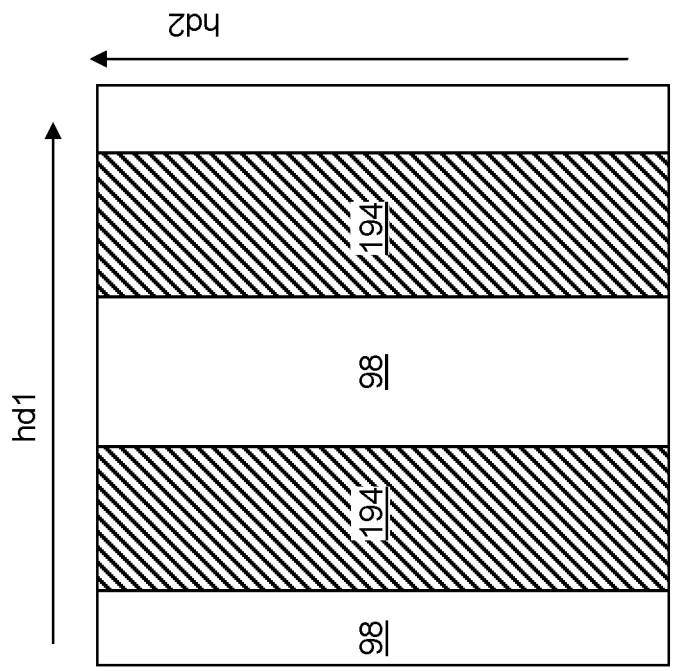
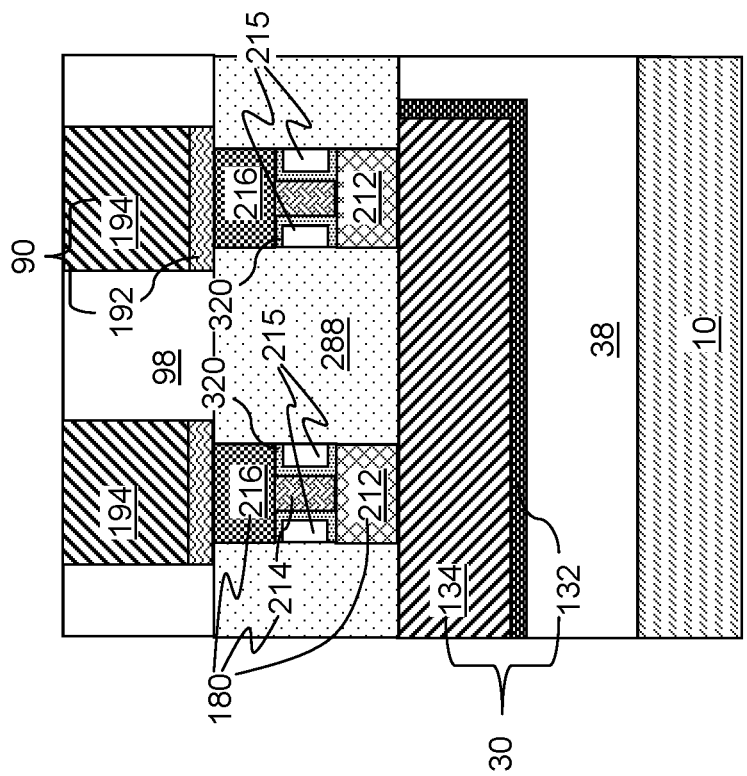
FIG. 17B
FIG. 17A

RESISTIVE MEMORY DEVICE INCLUDING A LATERAL AIR GAP AROUND A MEMORY ELEMENT AND METHOD OF MAKING THEREOF

FIELD

The present disclosure relates generally to the field of semiconductor devices and specifically to resistive memory devices including a lateral air gap around a memory element, and methods of making the same.

BACKGROUND

Previously known resistive memory devices are non-volatile memory devices employing non-volatile and reversible changes in resistance in a thin film with application of electrical voltage bias. As a "non-volatile" memory device, data stored in the resistive memory element does not change the value even when the power is turned off. In other words, the stored value of the data in any functional resistive memory device remains the same until the resistive memory element is reprogrammed, for example, in an erase operation or in a programming operation. The data stored in the non-volatile memory device can be reversed only when an electrical bias is applied in a direction that changes the resistive state of the memory device.

The resistive memory element is typically provided as a thin film, which is a solid-state material. Data can be stored in a resistive memory element by changing the resistance of the thin film. The thin film is referred to as a memory film or a read/write film. Examples of resistive random access memory (ReRAM) devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a resistive memory device comprises a first electrically conductive line laterally extending along a first direction, a vertical stack including, from bottom to top, a first electrode, a resistive memory material portion, and a second electrode, and contacting a top surface of the first electrically conductive line, a second electrically conductive line extending along a second direction and contacting a top surface of the vertical stack, a dielectric material contacting sidewalls of the first electrode and the second electrode, and cavity located at a same level as the resistive memory material portion, laterally surrounds the resistive memory material portion, and laterally separates the dielectric material from the resistive memory material portion.

According to another aspect of the present disclosure, a method of forming a resistive memory device is provided, which comprises the steps of: forming a first electrically conductive line laterally extending along a first direction over a substrate; forming a vertical stack including a first electrode, an in-process resistive memory material portion, and a second electrode over the first electrically conductive line; laterally recessing a sidewall of the in-process resistive memory material portion with respect to sidewalls of the first electrode and the second electrode to form a resistive memory material portion; forming a dielectric material layer around the first and second electrodes, wherein an annular cavity laterally surrounding the resistive memory material portion is formed between the resistive memory material portion and the dielectric material layer; and forming a second electrically conductive line extending along a second direction on the second electrode.

According to another embodiment of the disclosure, a resistive memory device comprises a first electrode located over a top surface of a substrate, a second electrode located over the first electrode, a resistive memory material portion located between the first electrode and the second electrode, a liner structure laterally surrounding the resistive memory material portion, a cavity laterally surrounding the liner structure, and a dielectric material surrounding the cavity. A sidewall of the resistive memory material portion is laterally recessed with respect to sidewalls of the first electrode and the second electrode such that the resistive memory material portion is narrower than each of the first and second electrodes in a direction parallel to the top surface of the substrate.

BRIEF DESCRIPTION OF THE DRAWINGS

FIG. 2A is a vertical cross-sectional view of a first exemplary structure after formation of first electrically conductive lines and a first line level dielectric material layer according to a first embodiment of the present disclosure.

FIG. 2B is a top-down view of the first exemplary structure of FIG. 2A.

FIG. 4A is a vertical cross-sectional view of the first exemplary structure after application and patterning of a photoresist layer according to the first embodiment of the present disclosure.

FIG. 4B is a top-down view of the first exemplary structure of FIG. 4A.

FIG. 5A is a vertical cross-sectional view of the first exemplary structure after formation of second electrodes, in-process memory material portions, and first electrodes according to the first embodiment of the present disclosure.

FIG. 5B is a top-down view of the first exemplary structure of FIG. 5A.

FIG. 6A is a vertical cross-sectional view of the first exemplary structure after formation of memory material portions by an isotropic etch according to the first embodiment of the present disclosure.

FIG. 6B is a top-down view of the first exemplary structure of FIG. 6A.

FIG. 7A is a vertical cross-sectional view of the first exemplary structure after formation of a memory level dielectric material layer according to the first embodiment of the present disclosure.

FIG. 7B is a top-down view of the first exemplary structure of FIG. 7A.

FIG. 8A is a vertical cross-sectional view of the first exemplary structure after formation of electrically conductive material layers according to the first embodiment of the present disclosure.

FIG. 8B is a top-down view of the first exemplary structure of FIG. 8A.

FIG. 10A is a vertical cross-sectional view of a second exemplary structure after formation of a continuous dielectric liner according to a second embodiment of the present disclosure.

FIG. 10B is a top-down view of the second exemplary structure of FIG. 10A.

FIG. 13A is a vertical cross-sectional view of the second exemplary structure after formation of second electrically conductive lines and a second line level dielectric material layer according to the second embodiment of the present disclosure.

FIG. 13B is a top-down view of the second exemplary structure of FIG. 13A.

FIG. 14A is a vertical cross-sectional view of a third exemplary structure after formation of a continuous metal nitride liner according to a third embodiment of the present disclosure.

FIG. 14B is a top-down view of the third exemplary structure of FIG. 14A.

FIG. 15A is a vertical cross-sectional view of a third exemplary structure after formation of metal nitride liner structures according to the third embodiment of the present disclosure.

FIG. 15B is a top-down view of the third exemplary structure of FIG. 15A.

FIG. 16A is a vertical cross-sectional view of the third exemplary structure after formation of a memory level dielectric material layer according to the third embodiment of the present disclosure.

FIG. 16B is a top-down view of the third exemplary structure of FIG. 16A.

FIG. 17A is a vertical cross-sectional view of the third exemplary structure after formation of third electrically conductive lines and a third line level dielectric material layer according to the third embodiment of the present disclosure.

FIG. 17B is a top-down view of the third exemplary structure of FIG. 17A.

DETAILED DESCRIPTION

Figure 1:
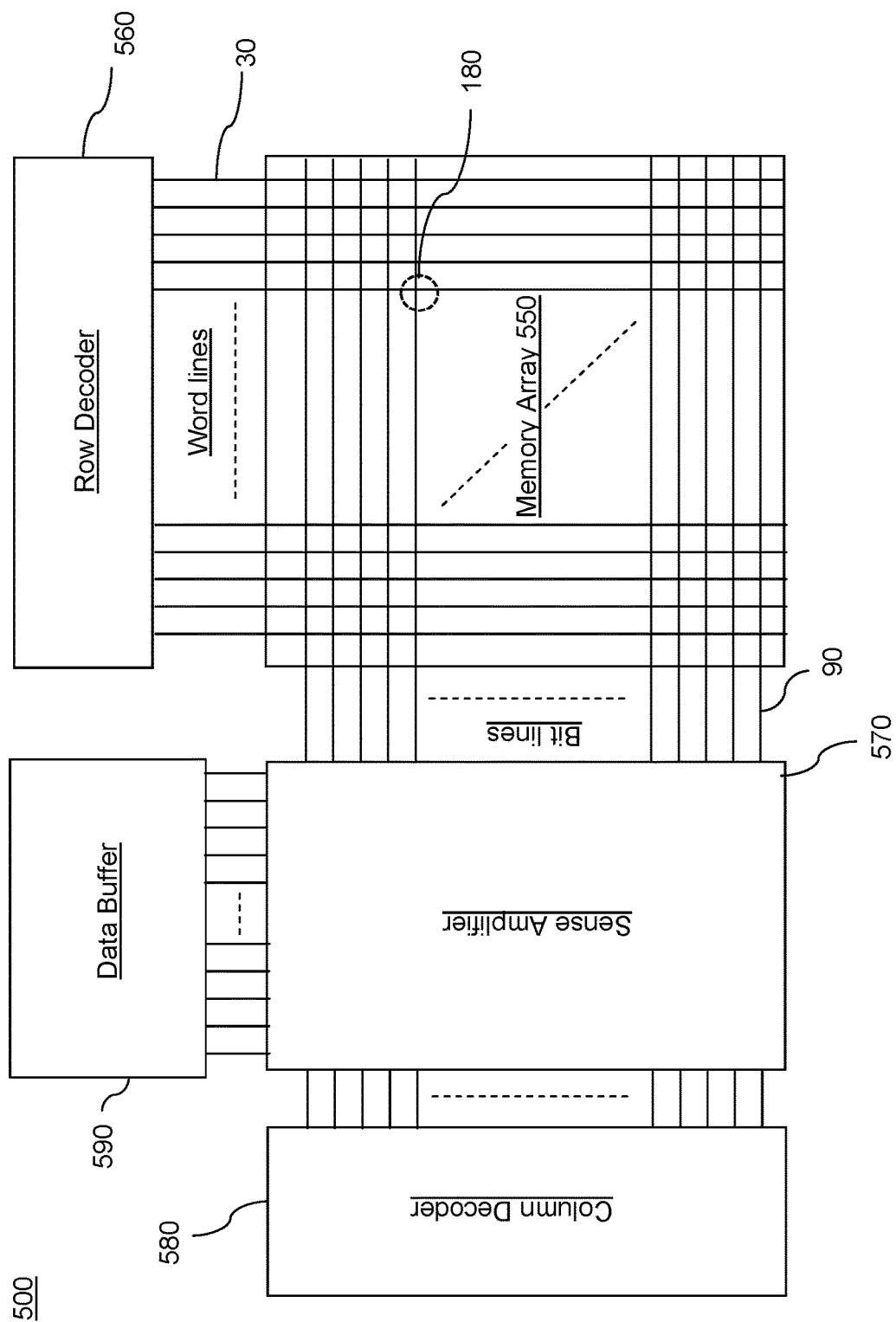
FIG. 1 is a schematic diagram of a memory device including resistive memory cells of the present disclosure in an array configuration.

As discussed above, the present disclosure is directed to resistive memory devices including a lateral air gap around a memory element and methods of making the same, the various aspects of which are described below. The embodiments of the disclosure can be employed to form various semiconductor devices including at least one non-volatile memory device. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or an "electrically conductive line" refers to a layer that has a predominant horizontal direction of extension, i.e., having a direction along which the layer extends the most and parallel to a top surface of an underlying substrate.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory element" refers to an element that includes a portion of a resistive memory material in a configuration that enables programming of the resistive memory material into at least two states having different values of electrical resistance.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

The various memory devices of the present disclosure can include a memory device, such as a non-volatile memory device employing a resistive memory element, and can be fabricated employing the various embodiments described herein. It is understood that a criss-cross array of memory elements that can be accessed by any access scheme can be employed for the resistive memory devices of the present disclosure, and the exemplary structures of the present disclosure are described herein merely provide non-limiting examples of implementation of the memory devices of the present disclosure.

Referring to FIG. 1, a schematic diagram is shown for a non-volatile memory device including non-volatile memory cells of the present disclosure in an array configuration. The non-volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory element.

The resistive random access memory device 500 of the present disclosure includes a memory array region 550 containing an array of the respective memory cells 180 located at the intersection of the respective word lines (which may be embodied as first electrically conductive lines 30 as illustrated or as second electrically conductive lines 90 in an alternate configuration) and bit lines (which may be embodied as second electrically conductive lines 90 as illustrated or as first electrically conductive lines 30 in an alternate configuration). The device 500 may also contain a row decoder 560 connected to the word lines, sense circuitry 570 (e.g., a sense amplifier) connected to the bit lines, a column decoder 580 connected to the bit lines and a data buffer 590 connected to the sense circuitry. Multiple instances of the resistive memory cells 180 are provided in an array configuration that forms the random access memory device 500. It should be noted that the location and interconnection of elements are schematic and the elements may be arranged in a different configuration.

The sense circuitry 570 is configured to measure a resistive state of each of the resistive memory cells 180 through respective bit lines. Each resistive memory cell 180 includes a resistive memory material portion between a first electrode and a second electrode. Configurations of the resistive memory cells 180 are described in detail in subsequent sections.

Each resistive memory cell 180 includes a resistive memory material portion, which can be selected from a phase change material portion providing at least two different levels of resistivity that depend on crystallinity, a non-filamentary metal oxide portion providing at least two different levels of resistivity depending on concentration of oxygen vacancies therein, and a filamentary metal oxide portion providing at least two different levels of resistivity depending on concentration of conductive filaments therein.

Referring to FIGS. 2A and 2B, a first exemplary structure according to an embodiment structure is illustrated, which is an in-process structure that can be employed to form a resistive memory device. As used herein, an "in-process" structure refers to a structure that is present during a manufacturing step and is subsequently modified in a later processing step. The first exemplary structure includes a first line level dielectric material layer 38 and a plurality of first electrically conductive lines 30 embedded with the first line level dielectric material layer 38. The first line level dielectric material layer 38 can be formed on, or over, a substrate 10. The substrate 10 can include a semiconductor substrate with peripheral semiconductor devices for supporting operation of the resistive memory array to be subsequently formed. For example, the semiconductor devices on the semiconductor substrate can include various components of the resistive random access memory device 500 shown in FIG. 1. Further, the substrate 10 can include at least one level of metal interconnect structures embedded in respective dielectric material layers.

The first line level dielectric material layer 38 includes a dielectric material such as silicon oxide, organosilicate glass, silicon nitride, and/or at least one dielectric metal oxide (such as aluminum oxide). In one embodiment, the first line level dielectric material layer 38 can include a silicon-oxide based dielectric material such as undoped silicate glass or doped silicate glass (such as borophosphosilicate glass or fluorosilicate glass). The first line level dielectric material layer 38 can be deposited by a conformal deposition process (such as low pressure chemical vapor deposition) or a non-conformal deposition process (such as plasma enhanced chemical vapor deposition). The thickness of the first line level dielectric material layer 38 can be in a range from 30 nm to 300 nm, although lesser and greater thicknesses can also be employed.

Line trenches extend along a first horizontal direction hd1 in an upper portion of the first line level dielectric material layer 38. As used herein, a line trench refers to a trench that extends along a lengthwise direction. The line trenches can be formed, for example, by applying a photoresist layer over the top surface of the first line level dielectric material layer 38, lithographically patterning openings that extend along the first horizontal direction hd1 through the photoresist layer, and by anisotropically etching unmasked portions of the first line level dielectric material layer 38 employing the patterned photoresist layer as an etch mask. Each line trench can extend along the first horizontal direction hd1, have a uniform width along a second horizontal direction hd2, be laterally spaced from one another along the second horizontal direction hd2, and can have a uniform depth. The remaining portions of the photoresist layer can be removed, for example, by ashing.

At least one metallic material can be deposited in the line trenches. For example, a first metallic liner 132 and a first conductive metal potion 134 can be sequentially deposited in each line trench. Each first metallic liner 132 in a line trench can include a metallic barrier material that functions as a diffusion barrier layer and/or an adhesion promotion layer. For example, each first metallic liner 132 can include a conductive metallic compound such as a conductive metallic nitride (such as TiN, TaN, or WN) or a conductive metallic carbide (such as TiC, TaC, or WC). The thickness of each first metallic liner 132 can be in a range from 3 nm to 10 nm, although lesser and greater thicknesses can also be employed. Each first conductive metal portion 134 in a line trench includes at least one conductive metal such as W, Cu, Al, Co, Ru, Ti, and/or Ta. In one embodiment, each first conductive metal portion 134 can consist essentially of a single metal such as W, Al, or Cu.

Excess portions of the deposited metallic material can be removed from above a horizontal plane including the top surface of the first line level dielectric material layer 38, for example, by chemical mechanical planarization (CMP). Each remaining adjoining set of a first metallic liner 132 and a first conductive material portion 134 constitutes a first electrically conductive line 30. The first electrically conductive lines 30 laterally extend along the first horizontal direction hd1, and are laterally spaced from one another along the second horizontal direction hd2. In one embodiment, the first electrically conductive lines 30 can form a one-dimensional periodic array having a periodicity along the second horizontal direction hd2.

Alternatively, instead of forming the first electrically conductive lines 30 employing a damascene method as described above, the first electrically conductive lines 30 and the first line level dielectric material layer 38 can be formed by forming the first electrically conductive lines 30 first, and subsequently depositing and planarizing a dielectric material to form the first line level dielectric material layer 38.

Each first electrically conductive line 30 can be a rail structure. As used herein, a "rail structure" refers to a structure that extends along a horizontal direction with a constant vertical cross-sectional shape. The first electrically conductive lines 30 collectively constitute a set of first rail structures disposed over the substrate.

Figure 3B:
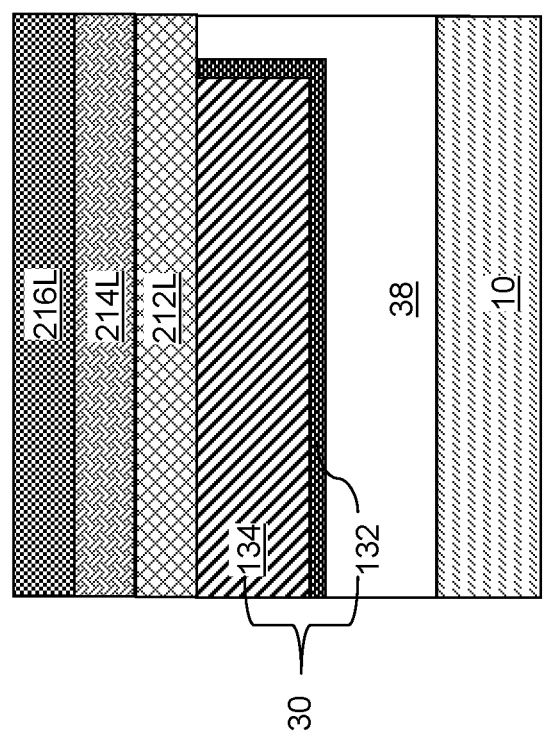
FIG. 3B is a top-down view of the first exemplary structure of FIG. 3A.
Figure 3A:
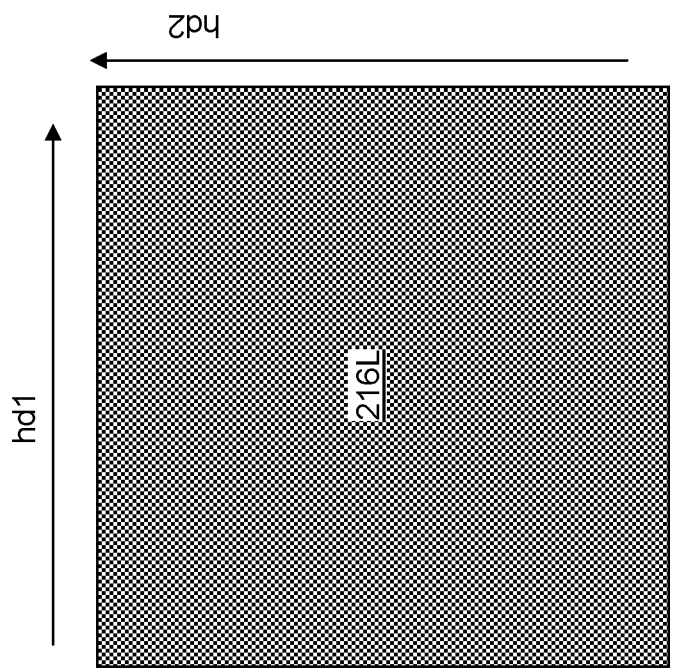
FIG. 3A is a vertical cross-sectional view of the first exemplary structure after formation of a first electrode material layer, a resistive memory material layer, and a second electrode material layer according to the first embodiment of the present disclosure.

Referring to FIGS. 3A and 3B, a vertical stack of blanket (unpatterned) material layers (212L, 214L, 216L) is formed over the first electrically conductive lines 30. The vertical stack of blanket material layers (212L, 214L, 216L) can be formed by sequentially depositing a first electrode material layer, 212L a resistive memory material layer 214L, and a second electrode material layer 216L.

The resistive memory material layer 214L includes a resistive memory material that are subsequently patterned to form the resistive memory material portions of resistive memory cells 180 to be subsequently formed. Thus, the resistive memory material layer 214L includes the resistive memory material of the resistive memory cells 180 of the present disclosure. As discussed above, the resistive memory material may be selected from, but are not limited to, a phase change material portion providing at least two different levels of resistivity that depend on crystallinity, a non-filamentary metal oxide material providing at least two different levels of resistivity depending on concentration of oxygen vacancies therein, and a filamentary metal oxide material providing at least two different levels of resistivity depending on concentration of conductive filaments therein.

In one embodiment, the resistive memory material of the resistive memory material layer 214L can include a phase change material such as a chalcogenide phase change material, for example $Ge_2Sb_2Te_5$ (GST). A phase change material changes resistivity depending on the crystalline state of the material. For example, a phase change material can have a high resistivity in an amorphous state, and can have a low resistivity in a polycrystalline state. In this case, the first electrode material layer, 212L and the second electrode material layer 216L can include a respective metallic barrier material layer such as a respective conductive metallic nitride layer. For example, each of the first and second electrode material layers (212L, 216L) can include at least one layer selected from a TiN layer, a TaN layer, and a WN layer. Optionally, each of the first and second electrode material layers (212L, 216L) can include one or more of a titanium layer, a tantalum layer, and a tungsten layer. Further, one or both of the first and second electrode material layers (212L, 216L) may optionally include a selector material layer that forms selector elements upon subsequent patterning of the first and second electrode material layers (212L, 216L).

In another embodiment, the resistive memory material of the resistive memory material layer 214L can include a non-filamentary metal oxide material. In this case, each of the resistive memory cells 180 may be a barrier modulated cell ("BMC") including a non-filamentary metal oxide portion. In this case, each resistive memory cell 180 can include a respective barrier material portion. In such embodiments, the resistive memory material portion may be an electrically conductive metal oxide that exhibits bulk electrical conduction (i.e., conductivity) by an oxygen vacancy mechanism. The resistive memory material portion can be a material portion which does not form conductive filaments or change its phase (e.g., from amorphous to polycrystalline) to change from a high to a low resistance state. Examples of such conductive metal oxides include a slightly sub-stoichiometric metal oxide such as $TiO_{2-x}$, $SrTiO_{3-x}$, $NbO_{2-x}$, or $Nb:SrTiO_{3-x}$ where value of x can be independently selected from a range from 0 to 1, such as greater than zero to 1 (i.e., to form a sub-stoichiometric, oxygen deficient metal oxide). For example, the resistive memory material portion may include titanium oxide, such as sub-stoichiometric titanium oxide having less than two oxygen atoms for each titanium atom. In one embodiment, the metal oxide may have a high concentration of free electrons in thermodynamic equilibrium n0 in a range from $1.0 \times 10^{20}/cm^3$ to $1.0 \times 10^{21}/cm^3$.

In this case, the first electrode material layer 212L and/or the second electrode material layer 216L can include a barrier material that provides a suitable electronic barrier to limit current through the resistive memory material portion. In one embodiment, the barrier material can be provided in the first electrode material layer 212L. In another embodiment, the barrier material can be provided in the second electrode material layer 216L. In one embodiment, the barrier material portion can provide a band gap in a range from 0.6 eV to 8 eV, such as 0.66 to 2.5 eV, and the barrier material portion can include a material such as an amorphous semiconductor material selected from silicon, germanium, a silicon-germanium alloy, a silicon-carbon alloy, a silicon-germanium-carbon alloy, or a III-V compound semiconductor material. In one embodiment, the barrier material portion includes a material selected from amorphous silicon, germanium and a silicon-germanium alloy, and the resistive memory material portion includes titanium oxide. Alternatively, the barrier material portion may comprise an electrically insulating material with an even higher band gap, such as amorphous or polycrystalline aluminum oxide having a band gap of about 7 to 7.6 eV. The width of the barrier material portion can be in a range from 10 nm to 120 nm, although lesser and greater widths can also be employed. Generally, a wide band gap material requires a lesser thickness, and a narrow band gap material requires a greater thickness. Each of the first and second electrode material layers (212L, 216L) can further include a metallic barrier material layer such as a conductive metallic nitride layer.

In yet another embodiment, the resistive memory material of the resistive memory material layer 214L can include a filamentary metal oxide material. In this case, the filamentary metal oxide material can change the conductivity depending on formation of conductive filaments therein. For example, the resistive memory material can include nickel oxide, hafnium oxide, zirconium oxide, or other filament-forming metal oxides known in the art. In this case, each of the first and second electrode material layers (212L, 216L) may include a metallic barrier material layer such as a conductive metallic nitride layer. Further, one or both of the first and second electrode material layers (212L, 216L) may further include a selector material layer that forms selector elements upon subsequent patterning of the first and second electrode material layers (212L, 216L).

The first electrode material layer 212L, the resistive memory material layer 214L, and the second electrode material layer 214L can be deposited by various methods such as physical vapor deposition (PVD), chemical vapor deposition (CVD), atomic layer deposition (ALD), electroplating, electroless plating, etc. The thickness of the first electrode material layer 212L can be in a range from 3 nm to 60 nm, although lesser and greater thicknesses can also be employed. The thickness of the resistive memory material layer 214L can be in a range from 10 nm to 600 nm, such as from 30 nm to 200 nm, although lesser and greater thicknesses can also be employed. The thickness of the second electrode material layer 214L can be in a range from 3 nm to 60 nm, although lesser and greater thicknesses can also be employed.

Referring to FIGS. 4A and 4B, a photoresist layer 217 can be applied over the top surface of the vertical stack of material layers (212L, 214L, 216L), and can be lithographically patterned to over isolated regions of the vertical stack of material layers (212L, 214L, 216L). For example, the photoresist layer 217 can be lithographically patterned to form isolated pillar patterns. Each lithographically patterned portion of the photoresist layer 217 can be positioned to form a two-dimensional array of pillar patterns. The two-dimensional array of pillar patterns formed by the discrete portions of the photoresist layer 217 can be repeated along the first horizontal direction hd1 with a first periodicity, and along the second horizontal direction hd2 with a second periodicity. The second horizontal direction hd2 may be orthogonal to the first horizontal direction hd1.

In one embodiment, each lithographically patterned portion of the photoresist layer 217 can be located within the areas of the first electrically conductive lines 30. If the first electrically conductive lines 30 are provided as a set of first rail structures, each lithographically patterned portion of the photoresist layer 217 can be located within areas of the set of the first rail structures. Each electrically patterned portion of the photoresist layer 217 can have a same horizontal cross-sectional shape, which can be a circular shape, an elliptical shape, a rectangular shape, or another polygonal or curvilinear closed shape. In one embodiment, the electrically patterned portion of the photoresist layer 217 can have a substantially circular shape of the same size.

Referring to FIGS. 5A and 5B, an anisotropic etch is performed to remove portions of the vertical stack of material layers (212L, 214L, 216L) that are not covered by the patterned portions of the photoresist layer 217. The anisotropic etches uncovered portions of the second electrode material layer 216L, the resistive memory material layer 214L, and the first electrode material layer 212L, and stops on the top surfaces of the first electrically conductive lines 30 and the first line level dielectric material layer 38. Each remaining portion of the second electrode material layer 216L constitutes a second electrode 216, each remaining portion of the resistive memory material layer 214L constitutes an in-process resistive memory material portion 214', and each remaining portion of the first electrode material layer 212L constitutes a first electrode 212. In one embodiment, each of the second electrodes 216, the in-process resistive memory material portions 214', and the first electrodes 212 can have a respective cylindrical shape. Each vertical stack of a first electrode 212, an in-process resistive memory material portion 214', and a second electrode 216 constitutes an in-process resistive memory cell 210.

A two-dimensional array of in-process resistive memory cells 210 can be formed on the top surfaces of the first electrically conductive lines 30. In one embodiment, each in-process resistive memory cell 210 may have a cylindrical shape, i.e., a shape having the same horizontal cross-sectional shape irrespective of the height of the horizontal cross-sectional view. In one embodiment, the in-process resistive memory cells 210 can have the same substantially circular cylindrical shape. In one embodiment, sidewalls of the in-process resistive memory cells 210 can be tapered, and each in-process resistive memory cell 210 may have a shape of a frustum. The horizontal cross-sectional shape of each in-process resistive memory cell 210 can be an elliptical shape, a rectangular shape, or another polygonal (e.g., triangular, hexagonal, etc.) or curvilinear closed horizontal cross sectional shape. In one embodiment, the entirety of each bottom surface of the in-process resistive memory cells 210 can be in physical contact with a top surface of a respective first electrically conductive layer 30. The photoresist layer 217 can be subsequently removed, for example, by ashing.

Referring to FIGS. 6A and 6B, an isotropic etch that isotropically etches the resistive memory material of the in-process memory material portions 214' is performed to form resistive memory material portions 214. The isotropic etch can etch the material of the in-process resistive memory material portions 214' selective to materials of the first electrodes 212 and the second electrode 216. For example, for chalcogenide phase change resistive memory material portions 214, a selective isotropic etch may use F/Cl/Br dry etch chemistries. Each sidewall of the in-process resistive memory material portions 214' is laterally recessed inward with respect to sidewalls of the first electrodes 212 and the second electrodes 216 to form the resistive memory material portions 214. The isotropic etch can include a wet etch process or a dry etch process. The chemistry of the isotropic etch process can be selected based on the material of the in-process resistive memory material portions 214' and the materials of the first electrodes 212 and the second electrodes 216.

An annular cavity 213 connected to the ambient can be formed around each resistive memory material portion 214. The maximum lateral dimension of each resistive memory material portion 214 can be in a range from 10% to 80%, such as from 20% to 60%, of the maximum lateral dimensions of the first and second electrodes (212, 216) within each vertical stack of a first electrode 212, a resistive memory material portion 214, and a second electrode 216. In one embodiment, the maximum lateral dimension of each resistive memory material portion 214 can be a sub-lithographic dimension, i.e., a dimension that is smaller than the minimum printable dimension employing a single photolithographic exposure and development. In one embodiment, the maximum lateral dimension of each resistive memory material portion 214 can be in a range from 6 nm to 100 nm, such as from 8 nm to 25 nm, although lesser and greater maximum lateral dimensions can also be employed for the resistive memory material portions 214. Each annular cavity 213 can be vertically bounded by a bottom horizontal annular surface of an overlying second electrode 216 and a top horizontal annular surface of an underlying first electrode 212. Each vertical stack of a first electrode 212, a resistive memory material portion 214, and a second electrode 216 constitutes a resistive memory element 180.

In one embodiment, the ratio of the recess distance of the sidewalls of the resistive memory material portion 214 to the height of a resistive memory material portion 214 can be in a range from 0.5 to 20, such as from 1.0 to 10. In one embodiment, the lateral dimension between a sidewall of the resistive memory material portion 214 and most proximal sidewalls of the first and second electrodes (212, 216) in a resistive memory cell 180 can be greater than the height of the resistive memory material portion 214. In one embodiment, the sidewall(s) (e.g., vertical sidewalls) of the resistive memory material portion 214 are recessed (i.e., inwardly offset) toward the center of the resistive memory material portion 214 from the respective vertical sidewall(s) of the first and second electrodes (212, 216) such that the resistive memory material portion 214 is narrower than each of the first and second electrodes (212, 216) in the horizontal direction (i.e., in a direction parallel to the top surface of the substrate 10).

Referring to FIGS. 7A and 7B, a dielectric material layer is anisotropically deposited over the array of the resistive memory elements 180. The dielectric material layer is formed at the level of the resistive memory elements 180, and is herein referred to as a memory level dielectric material layer 288. The memory level dielectric material layer 288 is formed by an anisotropic deposition method which deposits a dielectric material with directionality. For example, the memory level dielectric material layer 288 can be deposited by plasma enhanced chemical vapor deposition, vacuum evaporation, or physical vapor deposition. The memory level dielectric material layer 288 includes a dielectric material such as silicon oxide, organosilicate glass, silicon nitride, and/or at least one dielectric metal oxide (such as aluminum oxide).

The memory level dielectric material layer 288 is deposited around the first and second electrodes (212, 216) such that a cavity, such as an encapsulated annular cavity 215 is formed between the resistive memory material portion 214 and the memory level dielectric material layer 288. The cavity 215 laterally surrounds the resistive memory material portion 214 for each resistive memory element 180. The encapsulated annular cavity 215 is an annular cavity that is encapsulated by surfaces of the memory level dielectric material layer 288, an annular top surface of a first electrode 212, an annular bottom surface of a second electrode 216, and an outer sidewall (in case of a circular or elliptical horizontal cross-sectional shape for the resistive memory material portion 214) or a set of outer sidewalls (in cases of a polygonal horizontal cross-sectional shape for the resistive memory material portion 214) of the resistive memory material portion 214. In other words, the surfaces of the annular cavity 215 includes of the surfaces of the memory level dielectric material layer 288, the annular top surface of the first electrode 212, the annular bottom surface of the second electrode 216, and the outer sidewall (in case of a circular or elliptical horizontal cross-sectional shape for the resistive memory material portion 214) or the set of outer sidewalls (in cases of a polygonal horizontal cross-sectional shape for the resistive memory material portion 214) of the resistive memory material portion 214. The encapsulated annular cavity 215 can be topologically homeomorphic to a torus. Each encapsulated annular cavity 215 can be free of any condensed phase material. As used herein, condensed phase materials include all solid materials and all liquid materials, and excludes gas phase materials and vacuum. In other words, the cavity 215 can include a gas (e.g., air to form an air gap) or vacuum, but excludes liquid and solid materials. Each encapsulated annular cavity 215 laterally separates the memory level dielectric material layer 288 from a resistive memory material portion 214 that is laterally surrounded by the encapsulated annular cavity 215. In one embodiment, a sidewall of the memory level dielectric material layer 288 can be an outer boundary of the encapsulated annular cavity 215.

A planarization process can be performed to remove portions of the memory level dielectric material layer 288 that protrudes above a horizontal surface including top surfaces of the second electrodes 216. Chemical mechanical planarization and/or a recess etch can be performed for the planarization process.

Referring to FIGS. 8A and 8B, an optional metallic liner layer 192L and a conductive material layer 194L can be deposited. The optional metallic liner layer 192L, if present, can include a metallic barrier material that functions as a diffusion barrier layer and/or an adhesion promotion layer. In one embodiment, the metallic liner layer 192L can include a conductive metallic compound such as a conductive metallic nitride (such as TiN, TaN, or WN) or a conductive metallic carbide (such as TiC, TaC, or WC). The thickness of the metallic liner layer 192L can be in a range from 3 nm to 10 nm, although lesser and greater thicknesses can also be employed.

The conductive material layer 194L includes at least one conductive metal such as W, Cu, Al, Co, Ru, Ti, and/or Ta. In one embodiment, each first conductive metal portion 134 can consist essentially of a single metal such as W, Al, or Cu. The thickness of the conductive material layer 194L can be in a range from 10 nm to 600 nm, although lesser and greater thicknesses can also be employed.

Figures 9A, 9B:
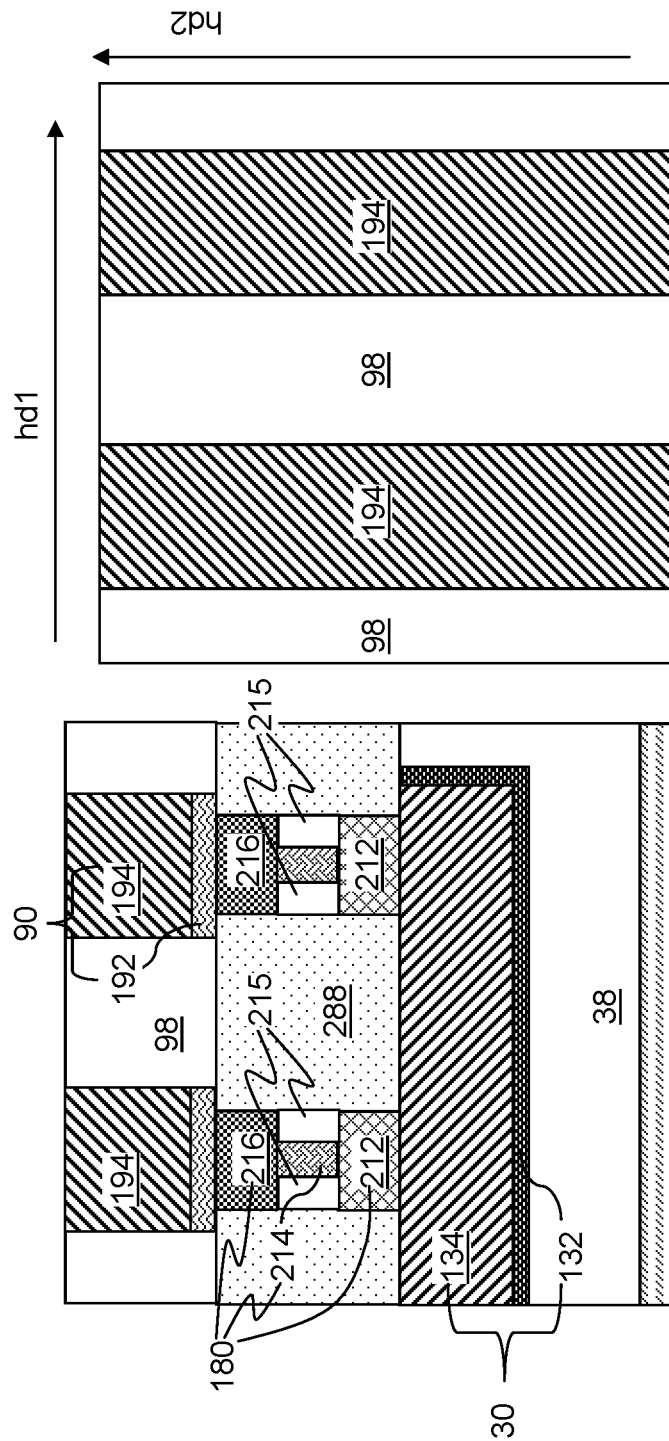
FIG. 9A is a vertical cross-sectional view of the first exemplary structure after formation of second electrically conductive lines and a second line level dielectric material layer according to the first embodiment of the present disclosure.
FIG. 9B is a top-down view of the first exemplary structure of FIG. 9A.

Referring to FIGS. 9A and 9B, the conductive material layer 194L and the optional metallic liner layer 192L can be patterned into second electrically conductive lines 90. In one embodiment, the second electrically conductive lines 90 can include second rail structures having a respective uniform width throughout. For example, a photoresist layer (not shown) can be applied over the conductive material layer 194 and can be lithographically patterned to form strips that laterally extend along the second horizontal direction hd2, and laterally spaced from one another along the first horizontal direction hd1. The pattern of the photoresist layer can be transferred by etching through the conductive material layer 194L and the optional metallic liner layer 192L to form the second electrically conductive lines 90. The second electrically conductive lines 90 can extend along the second horizontal direction hd2, and can be formed directly on the second electrodes 216.

The conductive material layer 194L and the optional metallic liner layer 192L can be patterned such that the entirety of each top surface of the second electrodes 216 is contacted by the bottom surfaces of a respective one of the second electrically conductive lines 90. Thus, the area of each resistive memory cell 180 can be entirely within an intersection of the area of a first electrically conductive line 30 (which may be a first rail structure) and a second electrically conductive line 90 (which may be a second rail structure). In this case, the entire bottom surface of each resistive memory cell 180 can contact a first electrically conductive line 30 and the entire top surface of each resistive memory cell 180 can contact a second electrically conductive line 90.

Subsequently, a dielectric material layer can be deposited in the spaces between the second electrically conductive lines 90. The dielectric material layer is herein referred to as a second line level dielectric material layer 98. The second line level dielectric material layer 98 includes a dielectric material such as silicon oxide, organosilicate glass, silicon nitride, and/or at least one dielectric metal oxide (such as aluminum oxide).

While the present disclosure is described employing an embodiment in which the second electrically conductive lines 90 are formed prior to formation of the second line level dielectric material layer 98, embodiments are expressly contemplated herein in which a dielectric material is deposited to form the second line level dielectric material layer 98 as a blanket material layer, and is subsequently patterned to form line trenches. The second electrically conductive lines 90 are then formed in the trenches by a damascene process.

Referring to FIGS. 10A and 10B, a second exemplary structure according to a second embodiment of the present disclosure can be derived from the first exemplary structure of FIGS. 6A and 6B by forming a continuous dielectric liner 220L by a conformal deposition method such as low pressure chemical vapor deposition or atomic layer deposition. The continuous dielectric liner 220L includes a dielectric material such as silicon oxide, silicon nitride, or a dielectric metal oxide. The thickness of the continuous dielectric liner 220L can be less than one half of the height of the resistive memory material portions 214. The volume of each annular cavity 213 is reduced due to deposition of the continuous dielectric liner 220L. Each annular cavity 213 is vertically bounded by horizontal surfaces of the continuous dielectric liner 220L after formation of the continuous dielectric liner 220L. Each annular cavity 213 laterally surrounds a respective resistive memory material portion 214. Each annular cavity 213 is laterally spaced from the respective resistive memory material portion 214 by the continuous dielectric liner 220L.

Figure 11A:
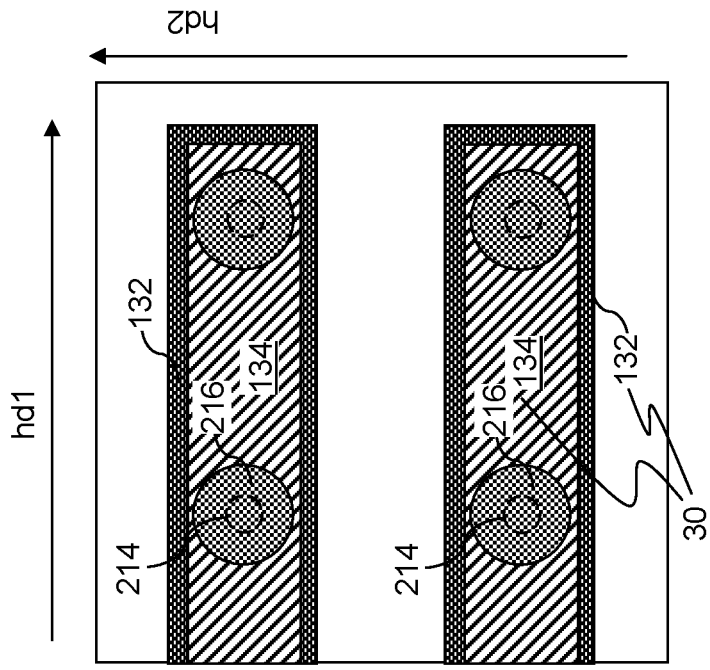
FIG. 11A is a vertical cross-sectional view of the second exemplary structure after formation of dielectric liner structures according to the second embodiment of the present disclosure.
Figure 11B:
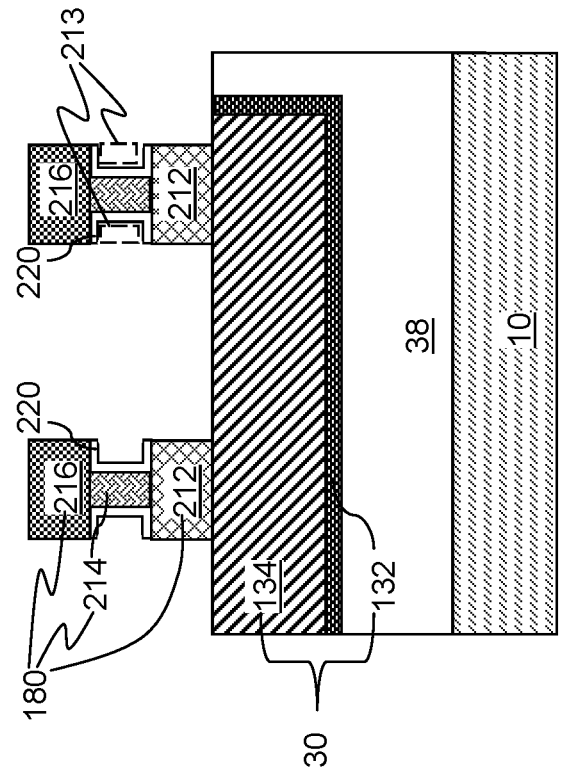
FIG. 11B is a top-down view of the second exemplary structure of FIG. 11A.

Referring to FIGS. 11A and 11B, portions of the continuous dielectric liner 220L located outside the volumes of the annular cavities 213 as provided at the processing steps of FIGS. 10A and 10B can be removed by an anisotropic etch. The anisotropic etch removes portions of the continuous dielectric liner 220L from above top surfaces of the second electrodes 216, from sidewalls of the second electrodes 216, from sidewalls of the first electrodes 212, and from above top surfaces of the first line structures 30 and the first line level dielectric material layer 38. In one embodiment, the anisotropic etch can be selective to the material of the second electrodes 216.

Each remaining portions of the continuous dielectric liner 220L underneath bottom surfaces of the second electrodes 216 constitutes a dielectric liner structure 220. Each dielectric liner structure 220 laterally surrounds a resistive memory material portion 214. An annular cavity 213 laterally surrounds each dielectric liner structure 220. The dielectric liner structure 220 can include an upper dielectric annular plate (i.e., an upper horizontal portion) contacting the second electrode 216 and overlying the annular cavity 213, a lower dielectric annular plate (i.e., a lower horizontal portion) contacting the first electrode 212 and underlying the annular cavity 213, and a dielectric tubular portion (i.e., a vertical portion) contacting the resistive memory material portion 214 and adjoined to an inner periphery of the upper dielectric annular plate and to an inner periphery of the lower dielectric annular plate.

Figures 12A, 12B:
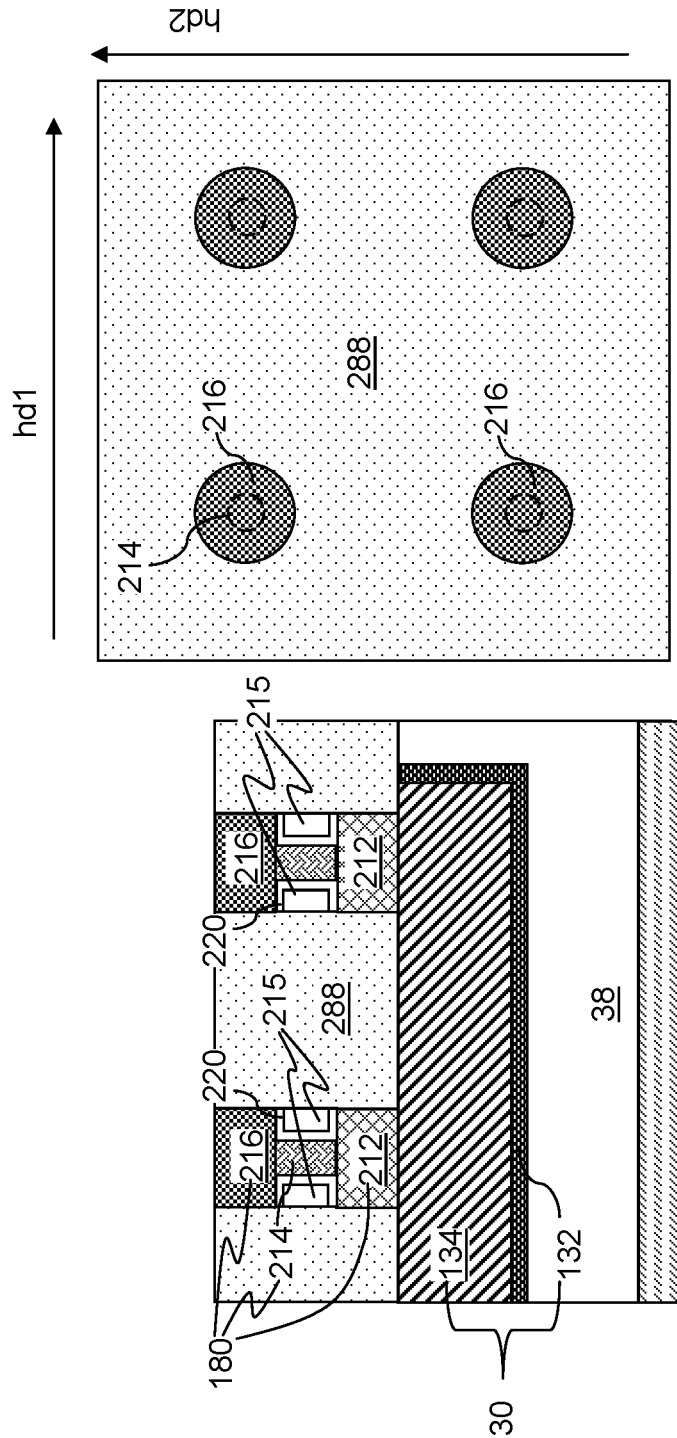
FIG. 12A is a vertical cross-sectional view of the second exemplary structure after formation of a memory level dielectric material layer according to the second embodiment of the present disclosure.
FIG. 12B is a top-down view of the second exemplary structure of FIG. 12A.

Referring to FIGS. 12A and 12B, the processing steps of FIGS. 7A and 7B can be performed to form a memory level dielectric material layer 288. An encapsulated annular cavity 215 is formed around each resistive memory material portion 214. Each encapsulated annular cavity 215 can be bounded by surfaces of the dielectric liner structure 220 and sidewalls of the memory level dielectric material layer 288. The dielectric liner structures 220 provide mechanical support to the resistive memory material portions 214 during manufacturing processing steps and during operation of the resistive memory cells 180 to prevent breakage or "snapping" of the resistive memory material portions 214.

Referring to FIGS. 13A and 13B, the processing steps of FIGS. 8A, 8B, 9A, and 9B can be performed to form second electrically conductive lines 90 and a second line level dielectric material layer 98.

Referring to FIGS. 14A and 14B, a third exemplary structure according to a third embodiment of the present disclosure can be derived from the first exemplary structure of FIGS. 6A and 6B by forming a continuous metal nitride liner 320L by a conformal deposition method such as low pressure chemical vapor deposition or atomic layer deposition. The continuous metal nitride liner 320L includes any suitable metal nitride material which can form a resistor between the first and second electrodes (212, 216) in parallel with the resistive memory material portion 214. For example, the metal nitride may include insulating metal nitride materials, such as aluminum nitride or hafnium nitride, or ternary materials having the formula M-X-N, where M is Ti or Ta and X is Al or Si, as described in U.S. published application 2015/0243884 A1, which is incorporated herein by reference in its entirety. The thickness of the continuous metal nitride liner 320L can be less than one half of the height of the resistive memory material portions 214.

The volume of each annular cavity 213 is reduced due to deposition of the continuous metal nitride liner 320L. Each annular cavity 213 is vertically bounded by horizontal surfaces of the continuous metal nitride liner 320L after formation of the continuous metal nitride liner 320L. Each annular cavity 213 laterally surrounds a respective resistive memory material portion 214. Each annular cavity 213 is laterally spaced from the respective resistive memory material portion 214 by the continuous metal nitride liner 320L.

Referring to FIGS. 15A and 15B, portions of the continuous metal nitride liner 320L located outside the volumes of the annular cavities 213 as provided at the processing steps of FIGS. 14A and 14B can be removed by an anisotropic etch. The anisotropic etch removes portions of the continuous metal nitride liner 320L from above top surfaces of the second electrodes 216, from sidewalls of the second electrodes 216, from sidewalls of the first electrodes 212, and from above top surfaces of the first line structures 30 and the first line level dielectric material layer 38. In one embodiment, the anisotropic etch can be selective to the material of the second electrodes 216.

Each remaining portions of the continuous metal nitride liner 320L underneath bottom surfaces of the second electrodes 216 constitutes a metal nitride liner structure 320. Each metal nitride liner structure 320 laterally surrounds a resistive memory material portion 214. An annular cavity 213 laterally surrounds each metal nitride liner structure 320. The metal nitride liner structure 320 can include an upper metal nitride annular plate (i.e., an upper horizontal portion) contacting the second electrode 216 and overlying the annular cavity 213, a lower metal nitride annular plate (i.e., a lower horizontal portion) contacting the first electrode 212 and underlying the annular cavity 213, and a metal nitride tubular portion (i.e., a vertical portion) contacting the resistive memory material portion 214 and adjoined to an inner periphery of the upper metal nitride annular plate and to an inner periphery of the lower metal nitride annular plate.

Referring to FIGS. 16A and 16B, the processing steps of FIGS. 7A and 7B can be performed to form a memory level dielectric material layer 288. An encapsulated annular cavity 215 is formed around each resistive memory material portion 214. Each encapsulated annular cavity 215 can be bounded by surfaces of the metal nitride liner structure 320 and sidewalls of the memory level dielectric material layer 288. The metal nitride liner structures 320 provide mechanical support to the resistive memory material portions 214 during manufacturing processing steps and during operation of the resistive memory cells 180 to prevent breakage or "snapping" of the resistive memory material portions 214 and also act as a parallel resistor to a phase change resistive memory material portion 214. The parallel resistor provides an alternative conductive path to the phase change resistive memory material portion 214 in the amorphous state during the read operation, which reduces the effect of amorphous material instability on the read operation, as described in S. Kim et al., "A phase change memory cell with metallic surfactant layer as a resistance drift stabilizer", IEDM Proceedings, December 2013, Pages 30.7.1 to 30.7.4.

Referring to FIGS. 17A and 17B, the processing steps of FIGS. 8A, 8B, 9A, and 9B can be performed to form second electrically conductive lines 90 and a second line level dielectric material layer 98.

Generally, at least one liner structure (220, 320) can be formed on the first exemplary structure illustrated in FIGS. 6A and 6B. In one embodiment, the at least one liner structure (220, 320) can be a plurality of liner structures that are formed as a stack. The at least one liner structure (220, 320) can be formed by conformally depositing at least one continuous liner (220L, 320L) within a volume formed by laterally recessing the sidewalls of the in-process resistive memory material portions 214' with respect to sidewalls of the first electrodes 212 and the second electrode 216, and over sidewalls of the first electrodes 212 and the second electrode 216. Subsequently, the at least one continuous liner (220L, 320L) can be anisotropically etched to remove portions of the at least one continuous liner (220L, 320L) from the sidewalls of the first electrodes 212 and the second electrodes 216. At least one remaining portion of the at least one continuous liner (220L, 320L) within the volume formed by laterally recessing the sidewall of the in-process resistive memory material portion 214' constitutes the at least one liner structure (220, 320).

Figure 18:
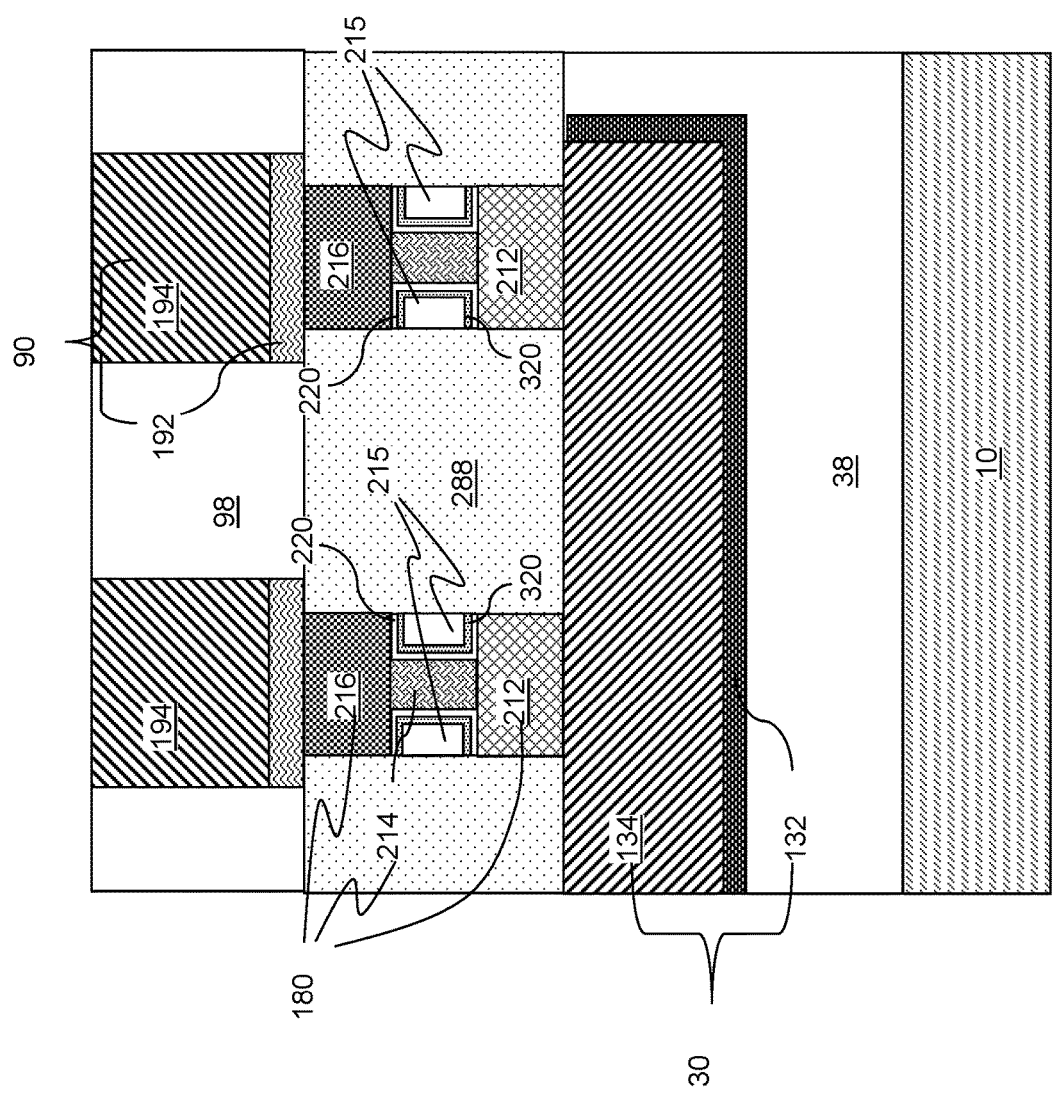
FIG. 18 is a vertical cross-sectional view of a fourth exemplary structure including a stack of a dielectric liner structure and a metal nitride liner structure around each resistive memory material portion according to a fourth embodiment of the present disclosure.

According to a fourth embodiment, the at least one continuous liner (220L, 320L) can be formed by depositing a continuous dielectric liner 220L first, and subsequently depositing a continuous metal nitride liner 320L on the continuous dielectric liner 220L. After an anisotropic etch process that removes portions of the at least one continuous liner (220L, 320L) from outside volumes of the annular cavities 213, at least one liner structure (220, 320) is formed as a stack of a dielectric liner structure 220 and a metal nitride liner structure 320 as illustrated in the fourth exemplary structure of FIG. 18. In other words, a stack of a dielectric liner structure 220 and a metal nitride liner structure 320 is formed around each resistive memory material portion 214 to provide mechanical strength and/or protection of the resistive memory material portion 214. Each encapsulated annular cavity 215 can be bounded by surfaces of a metal nitride liner structure 320 and sidewalls of the memory level dielectric material layer 288.

Figure 19:
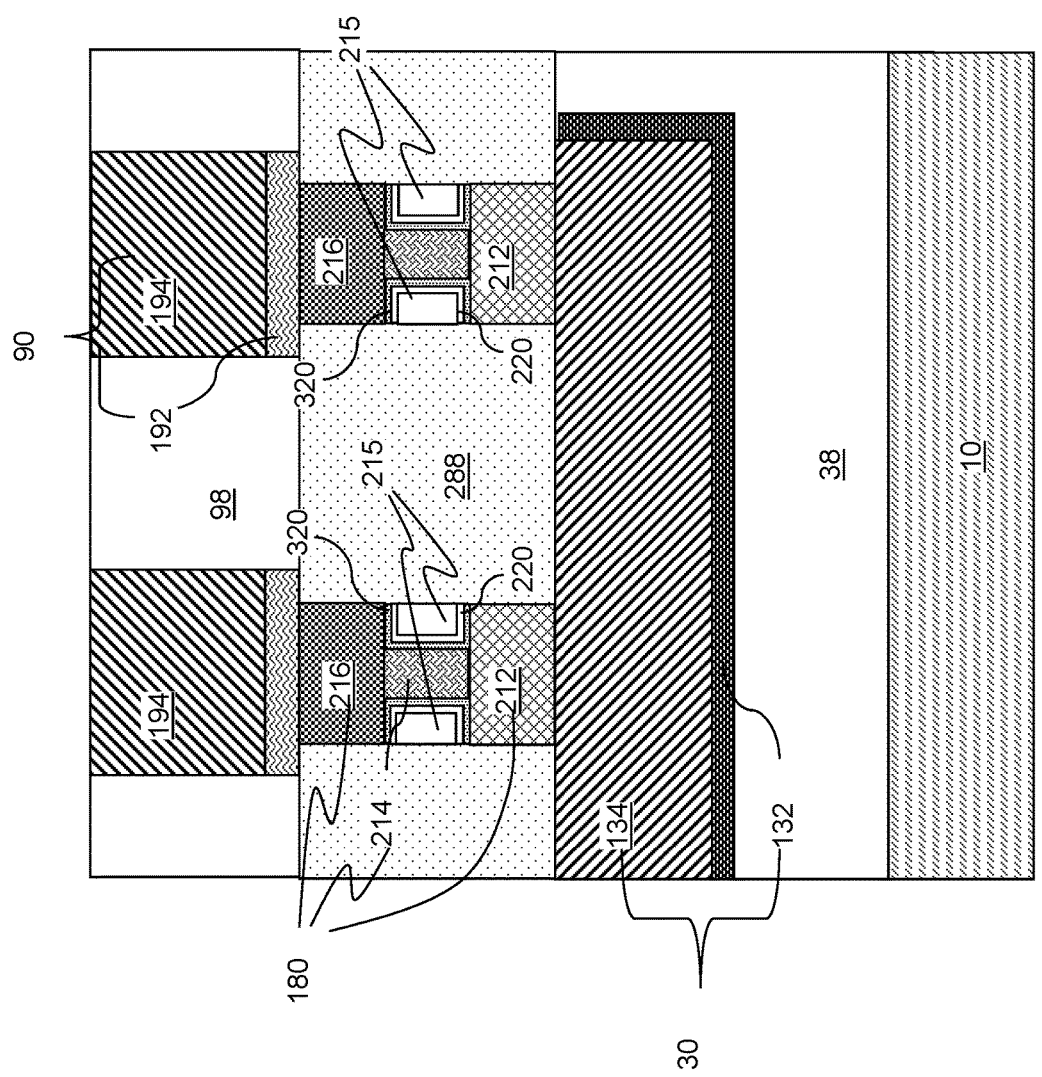
FIG. 19 is a vertical cross-sectional view of a fifth exemplary structure including a stack of a metal nitride liner structure and a dielectric liner structure around each resistive memory material portion according to a fifth embodiment of the present disclosure.

According to a fifth embodiment, the at least one continuous liner (220L, 320L) can be formed by depositing a continuous metal nitride liner first, and subsequently depositing a continuous dielectric liner 220L on the continuous metal nitride liner 320L. After an anisotropic etch process that removes portions of the at least one continuous liner (220L, 320L) from outside volumes of the annular cavities 213, at least one liner structure (220, 320) is formed as a stack of a metal nitride liner structure 320 and a dielectric liner structure 220 as illustrated in the fifth exemplary structure of FIG. 19. In other words, a stack of a metal nitride liner structure 320 and a dielectric liner structure 220 is formed around each resistive memory material portion 214 to provide mechanical strength and/or protection of the resistive memory material portion 214. Each encapsulated annular cavity 215 can be bounded by surfaces of a dielectric liner structure 220 and sidewalls of the memory level dielectric material layer 288.

Figure 20:
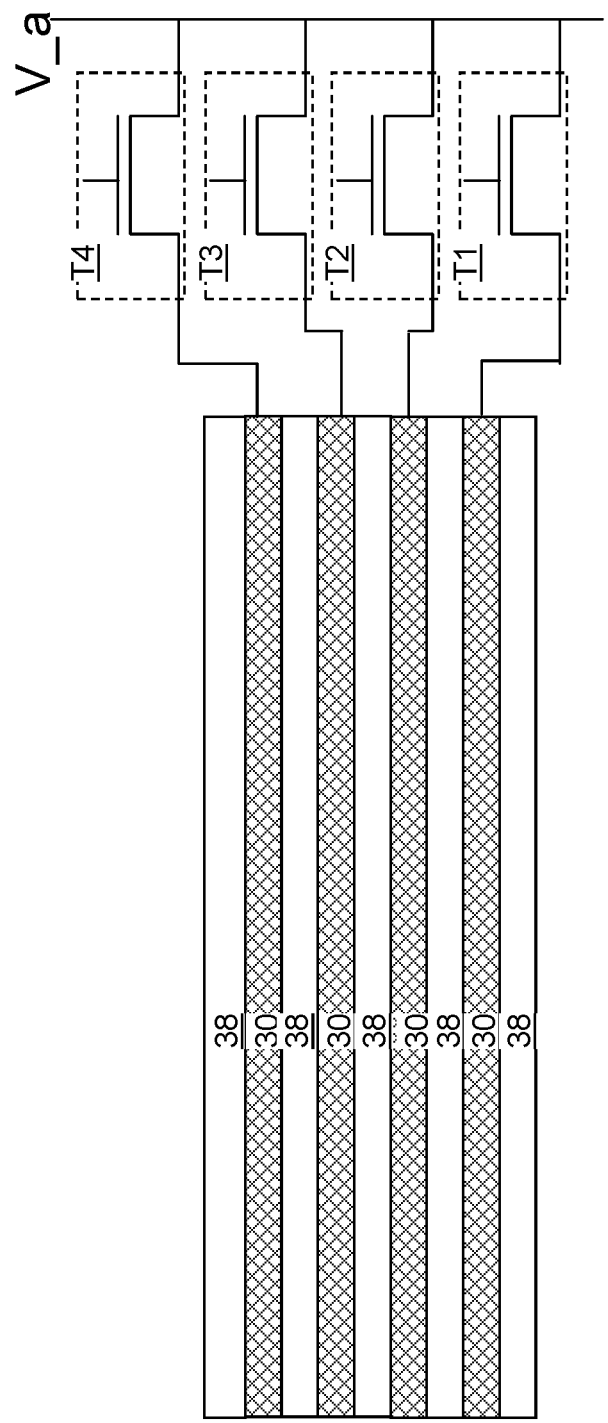
FIG. 20 illustrates a circuit schematic for electrically biasing the first line structures according to embodiments of the present disclosure.
Figure 21:
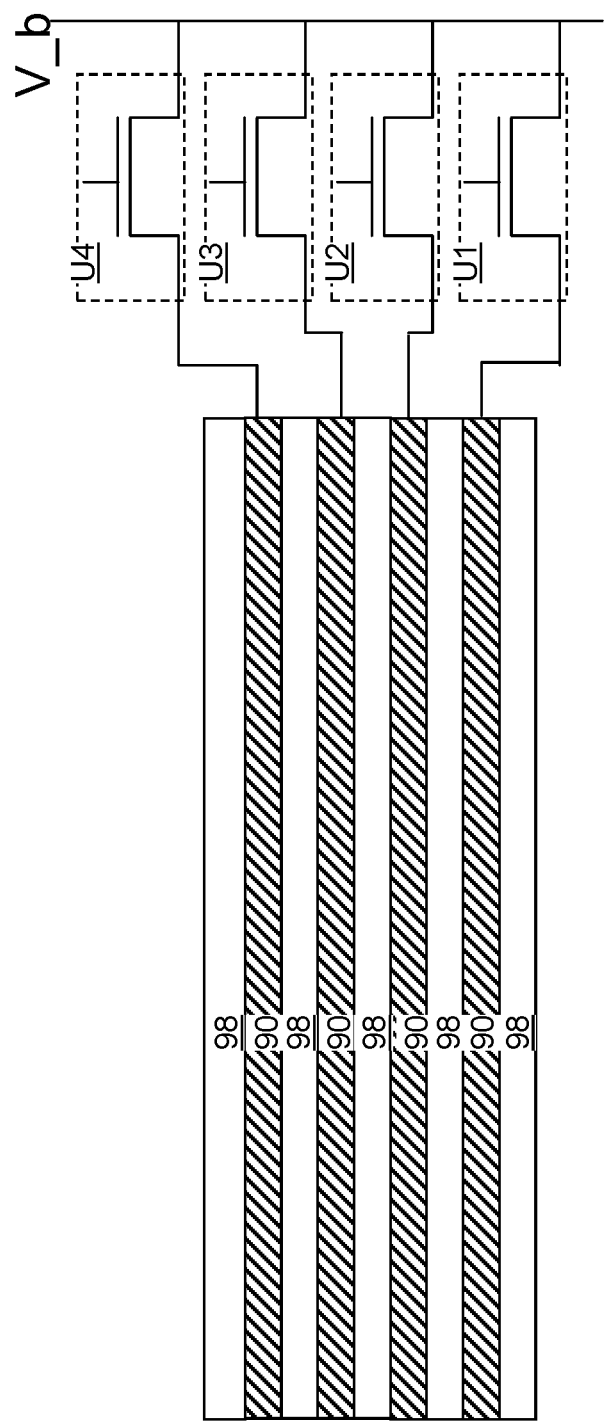
FIG. 21 illustrates a circuit schematic for electrically biasing the second line structures according to embodiments of the present disclosure.

Access transistors can be connected to each of the first electrically conductive lines 30 and the second electrically conductive lines 90. FIG. 20 is a schematic for a first set of access transistors (T1, T2, T3, T4) connected to the first electrically conductive lines 30 in a resistive random access memory device. The source node of each access transistor (T1, T2, T3, T4) can be connected to a word line access voltage V_a, which can be varied depending on the operational mode (e.g., a program mode or a read mode) of the memory devices. FIG. 21 is a schematic for a second set of access transistors (U1, U2, U3, U4) connected to the second electrically conductive lines 90 in a resistive random access memory device. The source node of each access transistor (U1, U2, U3, U4) can be connected to a bit line access voltage V_b, which can be varied depending on the operational mode (e.g., a program mode or a read mode) of the memory devices. The word line connections and the bit line connections may be interchanged as needed.

The various embodiments of the present disclosure can include a resistive memory device. In one embodiment, a resistive memory device of the present disclosure comprises a first electrically conductive line 30 laterally extending along a first direction (such as a first horizontal direction hd1); a vertical stack including, from bottom to top, a first electrode 212, a resistive memory material portion 214, and a second electrode 216, and contacting a top surface of the first electrically conductive line 30; a second electrically conductive line 90 extending along a second direction (such as a second horizontal direction hd2) and contacting a top surface of the vertical stack (212, 214, 216); a dielectric material layer 288 contacting sidewalls of the first electrode 212 and the second electrode 216, a top surface of the first electrically conductive line 30, and a bottom surface of the second electrically conductive line 90; and an annular cavity 215 that is free of any condensed phase material, located at a same level as the resistive memory material portion 214, laterally surrounds the resistive memory material portion 214, and laterally separates the dielectric material layer 288 from the resistive memory material portion 214.

The resistive memory device can include a first electrically conductive line 30 laterally extending along a first direction (such as a first horizontal direction hd1); a dielectric material layer 288 located over the first electrically conductive line 30; a second electrically conductive line 90 laterally located over the dielectric material layer 288 and extending along a second direction (such as a second horizontal direction hd2); and a resistive memory material portion 214 embedded within the dielectric material layer 288 and including a sidewall extending perpendicular to the first direction and the second direction, wherein an annular cavity 215 that is free of any condensed phase material laterally separates the dielectric material layer 288 from the resistive memory material portion 214.

In one embodiment, the first electrode 212 contacts a top surface of the first electrically conductive line 30 and a bottom surface of the resistive memory material portion 214; and the second electrode 216 contacts a bottom surface of the second electrically conductive line 90 and a top surface of the resistive memory material portion 214. In one embodiment, the annular cavity 215 is located between the top surface of the first electrode 212 and the bottom surface of the second electrode 216.

In one embodiment, the resistive memory device can further include a first electrode 212 located on the first electrically conductive line 30 and contacting a first surface of the resistive memory material portion 214; and a second electrode 216 located underneath the second electrically conductive line 90 and contacting a second surface of the resistive memory material portion 214. The annular cavity 215 can be located between the first electrode 212 and the second electrode 216. In one embodiment, the sidewall of the resistive memory material portion 214 can be laterally recessed inward with respect to sidewalls of the first electrode 212 and the second electrode 216.

In one embodiment, sidewalls of the first electrode 212 and the second electrode 216 extend along a vertical direction that is perpendicular to the first direction and the second direction, and the sidewalls of the first electrode 212 and the second electrode 216 are vertically coincident with each other. As used herein, two surfaces are vertically coincident with each other if the two surfaces overlie or underlie each other, and there exists a vertical plane that includes the two surfaces. In one embodiment, the sidewall of the resistive memory material portion 214 can be laterally offset from the sidewalls of the first electrode 212 and the second electrode 216 by a uniform lateral offset distance that is independent of an azimuthal angle around a vertical axis passing through a geometrical center of the resistive memory material portion 214. The uniform lateral offset distance can be the lateral etch distance during the isotropic etch of the in-process resistive memory material portions 214'. In one embodiment, each of the first electrode 212, the second electrode 216, and the resistive memory material portion 214 can have a respective cylindrical shape.

In one embodiment, the resistive memory device includes at least one liner structure (220, 320) laterally surrounding the resistive memory material portion 214 and laterally surrounded by the annular cavity 215.

In some embodiments, the at least one liner structure (220, 320) includes a dielectric liner structure 220 as illustrated in FIGS. 13A, 13B, 18, and 19. The dielectric liner structure 220 can include: an upper dielectric annular plate overlying the annular cavity 215; a lower dielectric annular plate underlying the annular cavity 215; and a dielectric tubular portion adjoined to an inner periphery of the upper dielectric annular plate and to an inner periphery of the lower dielectric annular plate.

In some embodiment, the at least one liner structure (220, 320) includes a metal nitride liner structure 320 as illustrated in FIGS. 17A, 17B, 18, and 19. The metal nitride liner structure 320 can include an upper metal nitride annular plate overlying the annular cavity 215; a lower metal nitride annular plate underlying the annular cavity 215; and a metal nitride tubular portion adjoined to an inner periphery of the upper metal nitride annular plate and to an inner periphery of the lower metal nitride annular plate.

In one embodiment, the at least one liner structure (220, 320) and the dielectric material layer 288 can include different materials, a first end of the resistive memory material portion 214 can be electrically shorted to the first electrically conductive line 30, and a second end of the resistive memory material portion 214 can be electrically shorted to the second electrically conductive line 90.

In one embodiment, the resistive memory material portion 214 includes a material selected from: a phase change material portion providing at least two different levels of resistivity that depend on crystallinity; a non-filamentary metal oxide portion providing at least two different levels of resistivity depending on concentration of oxygen vacancies therein; and a filamentary metal oxide portion providing at least two different levels of resistivity depending on concentration of conductive filaments therein.

The resistive memory material portion 214 of the resistive memory cell 180 of the present disclosure can have lesser (e.g., sub-lithographic) lateral dimensions than resistive memory material portions known in the art due to the recessing of the sidewalls of the resistive memory material portion 214. Thus, the resistive memory material portion 214 of the resistive memory cell 180 of the present disclosure can have a lesser volume, and can require a lesser programming current. Thus, the programming transistors and control devices can be scaled down for the resistive memory material portion 214 of the present disclosure. Further, the encapsulated annular cavities 215 of the present disclosure provide thermal isolation from the memory level dielectric material layer 288, thereby reducing the heat loss during programming of the phase change resistive memory material portions 214 and to reduce thermal "cross-talk" between neighboring cells containing phase change resistive memory material portions 214. Further, the optional liner structure (220 and/or 320) can provide structural reinforcement for the resistive memory material portion 214 and the second electrode 216 to prevent breakage of the resistive memory cell 180 and to reduce "drift" in programmed states of the device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A resistive memory device, comprising:
   a first electrically conductive line laterally extending along a first direction;
   a vertical stack including, from bottom to top, a first electrode, a resistive memory material portion, and a second electrode, and contacting a top surface of the first electrically conductive line;
   a second electrically conductive line extending along a second direction and contacting a top surface of the vertical stack;
   a dielectric material contacting sidewalls of the first electrode and the second electrode; and
   cavity located at a same level as the resistive memory material portion, laterally surrounds the resistive memory material portion, and laterally separates the dielectric material from the resistive memory material portion; and
   at least one liner structure laterally surrounding the resistive memory material portion and laterally surrounded by the annular cavity,
   wherein:
   the cavity comprises an annular cavity that is free of any condensed phase material;
   the dielectric material comprises a dielectric material layer which contacts a top surface of the first electrically conductive line, and a bottom surface of the second electrically conductive line;
   the first electrode contacts a top surface of the first electrically conductive line and a bottom surface of the resistive memory material portion;
   the second electrode contacts a bottom surface of the second electrically conductive line and a top surface of the resistive memory material portion; and
   the at least one liner structure comprises:
      a dielectric liner structure that includes an upper dielectric annular plate overlying the annular cavity, a lower dielectric annular plate underlying the annular cavity, and a dielectric tubular portion adjoined to an inner periphery of the upper dielectric annular plate and to an inner periphery of the lower dielectric annular plate; or
      a metal nitride liner structure that includes an upper metal nitride annular plate overlying the annular cavity, a lower metal nitride annular plate underlying the annular cavity, and a metal nitride tubular portion adjoined to an inner periphery of the upper metal nitride annular plate and to an inner periphery of the lower metal nitride annular plate.

2. The resistive memory device of claim 1, wherein the annular cavity is located between the top surface of the first electrode and the bottom surface of the second electrode.

3. The resistive memory device of claim 1, wherein a sidewall of the resistive memory material portion is laterally recessed inward with respect to sidewalls of the first electrode and the second electrode.

4. The resistive memory device of claim 1, wherein:
   sidewalls of the first electrode and the second electrode extend along a vertical direction that is perpendicular to the first direction and the second direction; and
   the sidewalls of the first electrode and the second electrode are vertically coincident with each other.

5. The resistive memory device of claim 4, wherein a sidewall of the resistive memory material portion is laterally offset from the sidewalls of the first electrode and the second electrode by a uniform lateral offset distance that is independent of an azimuthal angle around a vertical axis passing through a geometrical center of the resistive memory material portion.

6. The resistive memory device of claim 1, wherein each of the first electrode, the second electrode, and the resistive memory material portion has a respective cylindrical shape.

7. The resistive memory device of claim 1, wherein the at least one liner structure comprises the dielectric liner structure that includes:
   the upper dielectric annular plate overlying the annular cavity;
   the lower dielectric annular plate underlying the annular cavity; and
   the dielectric tubular portion adjoined to the inner periphery of the upper dielectric annular plate and to the inner periphery of the lower dielectric annular plate.

8. The resistive memory device of claim 1, wherein the at least one liner structure comprises the metal nitride liner structure that includes:
   the upper metal nitride annular plate overlying the annular cavity;
   the lower metal nitride annular plate underlying the annular cavity; and
   the metal nitride tubular portion adjoined to the inner periphery of the upper metal nitride annular plate and to the inner periphery of the lower metal nitride annular plate.

9. The resistive memory device of claim 1, wherein the resistive memory material portion comprises a material selected from:
   a phase change material portion providing at least two different levels of resistivity that depend on crystallinity of the phase change material;
   a non-filamentary metal oxide portion providing at least two different levels of resistivity depending on concentration of oxygen vacancies therein; and
   a filamentary metal oxide portion providing at least two different levels of resistivity depending on concentration of conductive filaments therein.

* * * * *